US012733217B2

(12) United States Patent
Kim et al.

(10) Patent No.: US 12,733,217 B2
(45) Date of Patent: Sep. 8, 2026

(54) GATE TRENCH POWER SEMICONDUCTOR DEVICES HAVING DEEP SUPPORT SHIELDS AND METHODS OF FABRICATING SUCH DEVICE

(71) Applicant: Wolfspeed, Inc., Durham, NC (US)

(72) Inventors: Woongsun Kim, Cary, NC (US); Naeem Islam, Morrisville, NC (US); Madankumar Sampath, Morrisville, NC (US); Sei-Hyung Ryu, Cary, NC (US)

(73) Assignee: Wolfspeed, Inc., Durham, NC (US)

( * ) Notice: Subject to any disclaimer, the term of this patent is extended or adjusted under 35 U.S.C. 154(b) by 420 days.

(21) Appl. No.: 18/482,097

(22) Filed: Oct. 6, 2023

(65) Prior Publication Data

US 2025/0120133 A1 Apr. 10, 2025

(51) Int. Cl.
*H01L 29/06* (2006.01)
*H01L 29/10* (2006.01)
(Continued)

(52) U.S. Cl.
CPC ......... *H10D 62/109* (2025.01); *H10D 12/031* (2025.01); *H10D 30/668* (2025.01);
(Continued)

(58) Field of Classification Search
CPC .... H10D 62/109; H10D 62/10; H10D 62/822; H10D 62/107; H10D 62/393; H10D 62/17; H10D 62/8325; H10D 62/832; H10D 12/031; H10D 12/01; H10D 12/0465; H10D 12/481; H10D 12/26506; H10D 12/038; H10D 30/668; H10D 30/66; H10D 30/673; H10D 64/252; H10D 64/23; H10D 64/256; H10D 64/62; H10D 84/146; H10D 84/00;
(Continued)

(56) References Cited

U.S. PATENT DOCUMENTS

| | | | |
|---|---|---|---|
| 7,989,882 B2 | 8/2011 | Zhang et al. | |
| 8,143,124 B2 * | 3/2012 | Challa | H10D 30/665 257/341 |

(Continued)

FOREIGN PATENT DOCUMENTS

| | | |
|---|---|---|
| DE | 102014200429 A1 | 7/2015 |

OTHER PUBLICATIONS

"Invitation to Pay Additional Fees and, Where Applicable, Protest Fee, for corresponding Application No. PCT/US2024/045467, dated Dec. 6, 2024, 20 pages".

(Continued)

*Primary Examiner* — Nikolay K Yushin
(74) *Attorney, Agent, or Firm* — Myers Bigel, P.A.

(57) ABSTRACT

A semiconductor device comprises a silicon carbide based semiconductor layer structure that includes a drift layer having a first conductivity type, a gate trench that extends to a first depth into an upper surface of the semiconductor layer structure, a gate electrode in the gate trench, a support shield trench that extends to a second depth into the upper surface of the semiconductor layer structure, where the second depth is less than the first depth, and a source metallization layer on the upper surface of the semiconductor layer structure and extending into the support shield trench.

20 Claims, 16 Drawing Sheets

(51) Int. Cl.

| | |
|---|---|
| ***H01L 29/66*** | (2006.01) |
| ***H01L 29/78*** | (2006.01) |
| ***H10D 12/01*** | (2025.01) |
| ***H10D 30/66*** | (2025.01) |
| ***H10D 62/10*** | (2025.01) |
| ***H10D 62/17*** | (2025.01) |
| ***H10D 62/832*** | (2025.01) |
| ***H10D 64/23*** | (2025.01) |
| ***H10P 30/22*** | (2026.01) |

(52) U.S. Cl.
CPC ....... *H10D 62/393* (2025.01); *H10D 62/8325* (2025.01); *H10D 64/252* (2025.01); *H10P 30/22* (2026.01)

(58) Field of Classification Search
CPC .. H10D 84/144; H10D 84/839; H10D 62/127; H10D 62/8503; H10D 62/85; H10D 62/124; H10D 62/343; H10D 12/461; H10D 30/4755; H10D 30/47; H10D 30/475; H10D 30/015; H10D 30/01; H10D 30/473; H10D 84/811; H10D 84/83; H10D 84/82; H10D 64/513; H10D 64/27; H10D 64/111; H10D 64/00; H10D 64/257; H01L 21/0465; H01L 21/04; H01L 21/047; H01L 21/76254; H01L 21/6834; H10P 30/22
See application file for complete search history.

(56) References Cited

U.S. PATENT DOCUMENTS

| | | | | |
|---|---|---|---|---|
| 9,024,379 | B2 | 5/2015 | Darwish et al. | |
| 10,304,954 | B2 | 5/2019 | Kobayashi et al. | |
| 11,075,264 | B2 | 7/2021 | Van Brunt et al. | |
| 11,398,556 | B2 | 7/2022 | Tanaka et al. | |
| 11,640,990 | B2 | 5/2023 | Lichtenwalner et al. | |
| 2008/0138953 | A1* | 6/2008 | Challa .................... | H10D 30/66 257/E21.546 |
| 2012/0037920 | A1 | 2/2012 | Treu et al. | |
| 2018/0012956 | A1 | 1/2018 | Ohashi et al. | |
| 2023/0307529 | A1 | 9/2023 | Kim et al. | |

OTHER PUBLICATIONS

"Notification of Transmittal of the International Search Report and the Written Opinion of the International Searching Authority, or the Declaration for corresponding International Application No. PCT/US2024/045455, mailing date: Jan. 28, 2025, (25 pages)".

"Disruptive Technology: ROHM Generation 4 SiC MOSFET, EE Times Asia, Jul. 7, 2022, downloaded from https://www.eetasia.com/express/disputive-technology-rohm-generation-4-sic-mosfet/".

"Notification of Transmittal of the International Search Report and the Written Opinion of the International Searching Authority, or the Declaration for corresponding International Application No. PCT/US2024/45467, mailing date: Jan. 28, 2025 (25 pages)".

* cited by examiner

GATE TRENCH POWER SEMICONDUCTOR DEVICES HAVING DEEP SUPPORT SHIELDS AND METHODS OF FABRICATING SUCH DEVICE

FIELD OF THE INVENTION

The present invention relates to power semiconductor devices and, more particularly, to power semiconductor devices having gate trenches and to methods of fabricating such devices.

BACKGROUND

The Metal Oxide Semiconductor Field Effect Transistor ("MOSFET") is a well-known type of semiconductor transistor that may be used as a switch. A MOSFET is a three terminal device that has gate, drain and source terminals and a semiconductor body. The semiconductor body is referred to herein as a "semiconductor layer structure" and may include one or more semiconductor layers/regions. A source region and a drain region are formed in the semiconductor layer structure that are separated by a channel region. A gate electrode (which may act as the gate terminal or be electrically connected to the gate terminal) is disposed adjacent the channel region and separated from the channel region by a thin oxide layer. A MOSFET may be turned on or off by setting a bias voltage that is applied to the gate electrode to be above or below a threshold value. When a MOSFET is turned on (i.e., it is in its "on-state"), current is conducted through the channel region between the source and drain regions. When the bias voltage is reduced below the threshold level, the current ceases to conduct through the channel region.

An n-type MOSFET has source and drain regions that have n-type (electron) conductivity and a channel region that has p-type (hole) conductivity (i.e., an "n-p-n" design). An n-type MOSFET turns on when a gate bias voltage is applied to the gate electrode that is sufficient to create a conductive n-type inversion layer in the p-type channel region, thereby electrically connecting the n-type source and drain regions and allowing for majority carrier conduction therebetween. A p-type MOSFET has a "p-n-p" design (i.e., p-type source and drain regions and an n-type channel region) and turns on when a gate bias voltage is applied to the gate electrode that is sufficient to create a conductive p-type inversion layer in the n-type channel region to electrically connect the p-type source and drain regions. Herein, the terms "first conductivity type" and "second conductivity type" are used to indicate either n-type or p-type, where the first and second conductivity types are different. Thus, if a first region of a device has a first conductivity type and a second region of the device has a second conductivity type, this means either that the first region has n-type conductivity and the second region has p-type conductivity or, alternatively, that first region has p-type conductivity and the second region has n-type conductivity.

As noted above, the gate electrode of a MOSFET is separated from the channel region by a thin oxide layer that is called a gate oxide layer. Other non-oxide gate dielectric layers may be used in certain applications in place of the gate oxide layer. It will be appreciated that the techniques according to embodiments of the present invention that are described herein are equally applicable to devices having gate dielectric layers formed with materials other than oxides.

Because the gate electrode of a MOSFET is insulated from the channel region by the gate oxide layer, minimal gate current is required to maintain the MOSFET in its on-state or to switch the MOSFET between its off-state and its on-state. The gate current is kept small during switching because the gate forms a capacitor with the channel region. Thus, only minimal charging and discharging current is required during switching, allowing for less complex gate drive circuitry and faster switching speeds. MOSFETs may be stand-alone devices or may be combined with other circuit devices. For example, an Insulated Gate Bipolar Transistor ("IGBT") is a semiconductor device that includes both a MOSFET and a Bipolar Junction Transistor ("BJT") that combines the high impedance gate electrode of the MOSFET with the small on-state conduction losses that may be provided by a BJT. An IGBT may be implemented, for example, as a Darlington pair that includes a high voltage n-channel MOSFET at the input and a BJT at the output. The base current of the BJT is supplied through the channel of the MOSFET, thereby allowing a simplified external drive circuit (since the drive circuit only charges and discharges the gate electrode of the MOSFET).

In some applications, MOSFETs may need to carry large currents and/or be capable of blocking high voltages. Such MOSFETs are often referred to as "power" MOSFETs. Power MOSFETs are often fabricated from wide band-gap semiconductor materials (herein, the term "wide band-gap semiconductor" encompasses any semiconductor having a band-gap of at least 1.4 eV). Power semiconductor devices are often formed in silicon carbide ("SiC"), which has a number of advantageous characteristics including, for example, a high electric field breakdown strength, high thermal conductivity, high electron mobility, high melting point and high-saturated electron drift velocity.

Power semiconductor devices such as power MOSFETs can have a lateral structure or a vertical structure. In a device having a lateral structure, the terminals of the device (e.g., the drain, gate and source terminals for a power MOSFET) are on the same major surface (i.e., top or bottom) of a semiconductor layer structure. In contrast, in a device having a vertical structure, at least one terminal is provided on each major surface of the semiconductor layer structure (e.g., in a vertical MOSFET, the source and gate may be on the top surface of the semiconductor layer structure and the drain may be on the bottom surface of the semiconductor layer structure). The semiconductor layer structure may or may not include an underlying substrate such as a growth substrate.

The semiconductor layer structure of a power semiconductor device typically includes an "active region" in which one or more functional semiconductor devices are formed. The active region acts as a main junction for blocking voltage during reverse bias (off-state) operation and providing current flow during forward bias (on-state) operation. The power semiconductor device may also have an edge termination structure such as guard rings or a junction termination extension in a termination region of the semiconductor layer structure that is adjacent (and typically surrounding) the active region. The edge termination structure may, among other things, reduce electric field crowding effects that can occur at the outer edges of a power semiconductor device. Typically, multiple power semiconductor devices are formed in/on a common wafer, and each power semiconductor device will typically have its own edge termination structure. After the wafer is fully processed, the resultant structure may be diced to separate the individual edge-terminated power semiconductor devices. Each power semiconductor device may have a unit cell structure in which the active region of each power semiconductor device includes a plurality of individual "unit cell" devices that are electrically connected in parallel and that together function as a single power semiconductor device.

Vertical power semiconductor devices that include a MOSFET can have a planar gate electrode design in which the gate electrode of the transistor is formed on top of the semiconductor layer structure or, alternatively, may have the gate electrode buried in a gate trench within the semiconductor layer structure. MOSFETs having buried gate electrodes are typically referred to as gate trench MOSFETs. With the planar gate electrode design, the channel region of each unit cell transistor is horizontally disposed underneath the gate electrode. In contrast, in the gate trench MOSFET design, the channels are typically vertically disposed adjacent sidewalls of the gate electrodes. Gate trench MOSFETs may provide enhanced performance, but typically require a more complicated manufacturing process.

One failure mechanism for a power MOSFET is the so-called "breakdown" of the gate oxide layer. The gate oxide layer is subjected to high electric fields during normal device operation. The stress on the gate oxide layer caused by these electric fields generates defects in the oxide material, and these defects build up over time. When the concentration of defects reaches a critical value, a so-called "percolation path" may be created through the gate oxide layer that electrically connects the gate electrode to the source or drain region, thereby creating a short-circuit that can destroy the device. The "lifetime" of a gate oxide layer (i.e., how long the device can be operated before breakdown occurs) is a function of, among other things, the magnitude of the electric field that the gate oxide layer is subjected to and the length of time for which the electric field is applied. FIG. 1 is a schematic graph illustrating the relationship between the operating time until breakdown occurs (the "gate oxide lifetime") and the level of the electric field applied to the gate oxide layer. This graph assumes that the same electric field is always applied (which is not necessarily the case). As shown in FIG. 1, the relationship may, in some cases, be generally linear when the gate oxide lifetime is plotted on a logarithmic scale. The important point to take from FIG. 1 is that as the electric field level is increased, the lifetime of the gate oxide layer decreases exponentially. The lifetime of the gate oxide layer may be increased by increasing the thickness of the gate oxide layer, but various performance parameters of a MOSFET may be a function of the thickness of the gate oxide layer and thus increasing the thickness of the gate oxide layer is typically not an acceptable way of increasing the lifetime of the gate oxide layer.

SUMMARY

Pursuant to some embodiments of the present invention, semiconductor devices are provided that comprise a silicon carbide based semiconductor layer structure that includes a drift layer having a first conductivity type, a gate trench that extends to a first depth into an upper surface of the semiconductor layer structure, a gate electrode in the gate trench, a support shield trench that extends to a second depth into the upper surface of the semiconductor layer structure, where the second depth is less than the first depth, and a source metallization layer on the upper surface of the semiconductor layer structure and extending into the support shield trench.

In some embodiments, the semiconductor layer structure further comprises a well contact region having a second conductivity type underneath the support shield trench.

In some embodiments, the semiconductor layer structure further comprises a support shield having the second conductivity type underneath the well contact region. In some embodiments, the source metallization layer directly contacts the well contact region and the well contact region directly contacts the support shield.

In some embodiments, the semiconductor layer structure further comprises a trench shielding region having the second conductivity type underneath the gate trench.

In some embodiments, semiconductor layer structure further comprises a well region having the second conductivity type on an upper surface of the drift layer and a source region having the first conductivity type on an upper surface of the well region.

In some embodiments, the source metallization layer in the support shield trench directly contacts a side surface of the source region and an upper surface of the well contact region.

In some embodiments, the well contact region has a first doping concentration of second conductivity type dopants that is at least an order of magnitude greater than a second doping concentration of second conductivity type dopants of the well region. In some embodiments, the first doping concentration of second conductivity type dopants is at least an order of magnitude greater than a third doping concentration of second conductivity type dopants of the support shield.

In some embodiments, the semiconductor layer structure further comprises a source region, and the source metallization layer directly contacts both an upper surface and a side surface of the source region.

In some embodiments, the support shield extends farther downwardly into the semiconductor layer structure than does the trench shielding region.

In some embodiments, the well contact region electrically connects the well region to the source metallization layer.

Pursuant to further embodiments of the present invention, semiconductor devices are provided that comprise a silicon carbide based semiconductor layer structure that comprises a drift layer having a first conductivity type, a well region having the second conductivity type on an upper surface of the drift layer, a source region having the first conductivity type on the well region, a well contact region having the second conductivity type in the well region, where an upper surface of the well contact region is recessed below an upper surface of the source region, and a support shield having the second conductivity type underneath the well contact region. The support shield extends into the drift layer. The semiconductor device further comprises a gate trench in an upper surface of the semiconductor layer structure, a gate electrode in the gate trench, a support shield trench in the upper surface of the semiconductor layer structure, and a metal layer that extends into the support shield trench.

In some embodiments, the semiconductor layer structure further comprises a trench shielding region having the second conductivity type underneath the gate trench.

In some embodiments, the well contact region has a first doping concentration of second conductivity type dopants that is at least an order of magnitude greater than a second doping concentration of second conductivity type dopants of the well region.

In some embodiments, the metal layer in the support shield trench directly contacts a side surface of the source region and an upper surface of the well contact region.

In some embodiments, the gate trench extends farther downwardly into the semiconductor layer structure than does the support shield trench.

In some embodiments, the well contact region has a first doping concentration of second conductivity type dopants that is at least an order of magnitude greater than a third doping concentration of second conductivity type dopants of the support shield.

In some embodiments, the metal layer directly contacts both an upper surface and a side surface of the source region.

In some embodiments, the support shield extends farther downwardly into the semiconductor layer structure than does the trench shielding region.

In some embodiments, the well contact region electrically connects the well region to the metal layer.

Pursuant to additional embodiments of the present invention, semiconductor devices are provided that comprise a silicon carbide based semiconductor layer structure that comprises a drift layer having a first conductivity type, a well region having a second conductivity type on an upper surface of the drift layer, a source region having the first conductivity type on an upper surface of the well region, and a well contact region having the second conductivity type in the well region, the well contact region being a portion of the well region that has a higher dopant concentration. An upper surface of the well contact region is recessed below an upper surface of the source region. The semiconductor device further comprises a gate trench that extends to a first depth into an upper surface of the semiconductor layer structure and a source metallization that extends in between source regions of adjacent ones of the unit cell transistors to directly contact the well contact region.

In some embodiments, the semiconductor layer structure further comprises a support shield having the second conductivity type underneath the well contact region. In some embodiments, the source metallization directly contacts the well contact region and the well contact region directly contacts the support shield.

In some embodiments, the source metallization layer directly contacts a side surface of the source region.

In some embodiments, the well contact region has a first doping concentration of second conductivity type dopants that exceeds a second doping concentration of second conductivity type dopants of the well region and that also exceeds a third doping concentration of second conductivity type dopants of the support shield.

In some embodiments, the semiconductor layer structure further comprises a trench shielding region having the second conductivity type underneath the gate trench, and the support shield extends farther downwardly into the semiconductor layer structure than does the trench shielding region.

Pursuant to additional embodiments of the present invention, semiconductor devices are provided that comprise a silicon carbide based semiconductor layer structure that comprises a drift layer having a first conductivity type, a well region having the second conductivity type on an upper surface of the drift layer, a source region having the first conductivity type on an upper surface of the well region, and a well contact region having the second conductivity type in the well region, the well contact region being a portion of the well region that has a higher dopant concentration. These devices further include a source metallization layer that contacts upper and side surfaces of the source regions and contacts an upper surface of the well contact region.

In some embodiments, the semiconductor layer structure further comprises a support shield having the second conductivity type underneath the well contact region. In some embodiments, the source metallization layer directly contacts the well contact region and the well contact region directly contacts the support shield.

In some embodiments, the well contact region has a first doping concentration of second conductivity type dopants that exceeds a second doping concentration of second conductivity type dopants of the well region and that also exceeds a third doping concentration of second conductivity type dopants of the support shield.

In some embodiments, the semiconductor layer structure further comprises a trench shielding region having the second conductivity type underneath the gate trench, and the support shield extends farther downwardly into the semiconductor layer structure than does the trench shielding region.

Pursuant to still further embodiments of the present invention, semiconductor devices are provided that comprise a silicon carbide based semiconductor layer structure that comprises a drift layer having a first conductivity type, a well region having the second conductivity type on an upper surface of the drift layer, a well contact region having the second conductivity type extending downwardly through the well region and into the drift layer, a gate trench in an upper surface of the semiconductor layer structure, a gate electrode in the gate trench, a support shield trench extending through the well contact region, the support shield trench extending farther downwardly into the semiconductor layer structure than the well contact region, and a support shield in the support shield trench.

In some embodiments, the support shield directly contacts the well contact region.

In some embodiments, the support shield trench extends farther downwardly into the semiconductor layer structure than the gate trench.

In some embodiments, the semiconductor layer structure further comprises a trench shielding region having the second conductivity type underneath the gate trench, and the support shield trench extends farther downwardly into the semiconductor layer structure than the trench shielding region.

In some embodiments, the well contact region has a first doping concentration of second conductivity type dopants that is at least an order of magnitude greater than a second doping concentration of second conductivity type dopants of the well region.

In some embodiments, the support shield comprises doped polysilicon, nickel oxide, or a metal that makes a Schottky contact to silicon carbide.

In some embodiments, the semiconductor layer structure further comprises a source region having the first conductivity type on the well region, and the well contact region is positioned between the support shield and the well region and between the support shield and the source region.

In some embodiments, the well contact region extends through the well region and into the drift layer.

In some embodiments, the well contact region extends at least as deep into the semiconductor layer structure as the gate trench.

Pursuant to other embodiments of the present invention, semiconductor devices are provided that comprise a semiconductor layer structure that comprises drift layer having a first conductivity type, a well region having the second conductivity type on an upper surface of the drift layer, a well contact region having the second conductivity type extending downwardly through the well region and into the drift layer, and a source region having the first conductivity type on an upper surface of the well region. These semiconductor devices further comprise a gate trench in an upper surface of the semiconductor layer structure, a gate electrode in the gate trench, a trench extending into the well contact region, and a conductive material other than silicon carbide in the trench.

In some embodiments, the semiconductor layer structure further comprises a trench shielding region having the second conductivity type underneath the gate trench, and the support shield extends downwardly farther into the semiconductor layer structure than the trench shielding region.

In some embodiments, the conductive material comprises doped polysilicon, nickel oxide, or a metal that makes a Schottky contact to silicon carbide.

In some embodiments, the support shield extends to the upper surface of the semiconductor layer structure.

In some embodiments, the trench extends farther into the semiconductor layer structure than the gate trench.

In some embodiments, the trench does not extend through a bottom surface of the well contact region.

In some embodiments, the well contact region extends at least as deep into the semiconductor layer structure as the gate trench.

Pursuant to further embodiments of the present invention, method of forming a semiconductor device are provided. Pursuant to these methods a silicon carbide based semiconductor layer structure is provided that includes a drift layer having a first conductivity type. A gate trench is formed that extends to a first depth into an upper surface of the semiconductor layer structure. A gate electrode is formed in the gate trench. A support shield trench is formed that extends to a second depth into the upper surface of the semiconductor layer structure, where the second depth is less than the first depth. A source metallization layer is formed on the upper surface of the semiconductor layer structure and extending into the support shield trench.

In some embodiments, the support shield trench is formed before the gate trench is formed.

In some embodiments, the method further comprises forming a well contact region having a second conductivity type underneath the support shield trench.

In some embodiments, the method further comprises forming a support shield having the second conductivity type underneath the well contact region.

In some embodiments, the source metallization layer directly contacts the well contact region and the well contact region directly contacts the support shield.

In some embodiments, the method further comprises forming a well region having the second conductivity type on an upper surface of the drift layer, forming a source region having the first conductivity type on an upper surface of the well region, and forming a trench shielding region having the second conductivity type underneath the gate trench.

In some embodiments, the source metallization layer in the support shield trench directly contacts a side surface of the source region and an upper surface of the well contact region.

In some embodiments, the support shield extends farther downwardly into the semiconductor layer structure than does the trench shielding region.

In some embodiments, the well contact region has a first doping concentration of second conductivity type dopants that is at least an order of magnitude greater than a second doping concentration of second conductivity type dopants of the well region and is at least an order of magnitude greater than a third doping concentration of second conductivity type dopants of the support shield.

DETAILED DESCRIPTION

Figure 1:
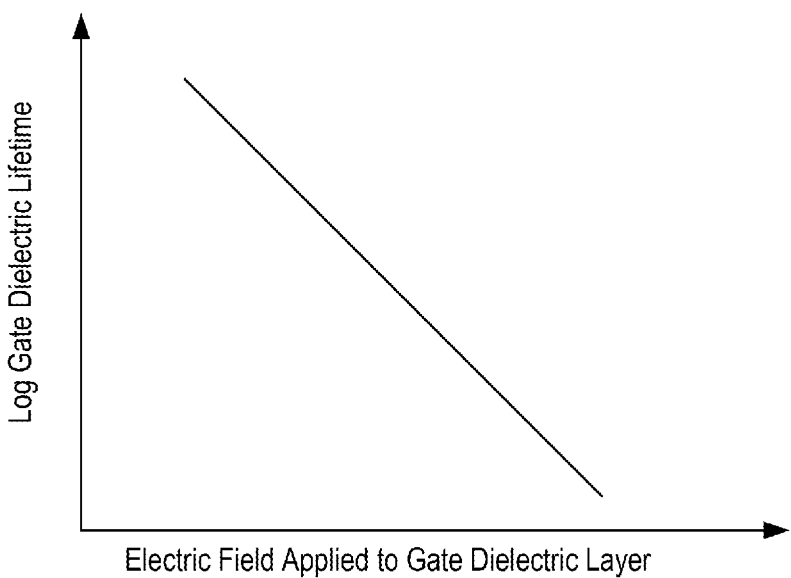
FIG. 1 is a semi-log graph illustrating the relationship between the lifetime of the gate oxide layer as a function o In some embodiments, an upper surface of the well contact region is recessed below an upper surface of the well region. f applied electric field strength.

Vertical silicon carbide based power semiconductor devices that have gate trenches such as vertical power MOSFETs and IGBTs are attractive for many applications due to their inherent lower specific on-resistance, which may result in more efficient operation for power switching operations. Gate trench vertical power devices exhibit lower specific resistance during on-state operation because the channel is formed in the sidewall of the gate trench. Moreover, the carrier mobility in sidewall channels may be about 2-4 times higher than the corresponding carrier mobility in the horizontal channel of a standard (i.e., non-gate trench) vertical power device, which results in increased current density during on-state operation allowing for higher switching speeds. The gate trench design also reduces the overall pitch of the device, allowing for increased integration. The lower conduction losses (due to the reduced on-state resistance) and improved switching speeds make gate trench power devices particularly well-suited for high frequency power applications having low to moderate voltage blocking requirements (e.g., 600-1200 Volts). These devices may have reduced requirements for associated passive components and require relatively simple cooling schemes. As MOSFETs are the most widely used silicon carbide based gate trench power semiconductor devices, the discussion below focuses on MOSFET embodiments. It will be appreciated, however, that each of the described embodiments may alternatively be implemented using non-oxide gate dielectric layers (e.g., nitrides, high dielectric constant materials, etc.), and that the same techniques may be used to form other gate trench power semiconductor devices such as IGBTs, gate-controlled thyristors and the like.

As discussed above, gate trench power MOSFETs are susceptible to oxide reliability issues due to the presence of high electric fields in the gate oxide layers that line the bottoms and sidewalls of the gate trenches. The high electric fields degrade the gate oxide layer over time, and may eventually result in failure of the device. When gate trench MOSFETs operate in reverse blocking operation (i.e., when the MOSFET is in its off-state), the source terminal of the MOSFET is typically grounded, the gate terminal is typically grounded or at a negative bias voltage, and the drain terminal is typically at a high positive voltage. During such reverse blocking operations, high electric fields extend upwardly from the drain terminal (which is on the bottom surface of the semiconductor layer structure) toward the top surface of the semiconductor layer structure. Thus, under reverse blocking operation, the bottom portion of the gate dielectric layer experiences the highest electric field levels. Due to electric field crowding effects, the electric field levels in the lower "corners" of the gate oxide layer at the bottom edges of the gate trench may be particularly high (i.e., the portions of the gate oxide layers that cover the region where the sidewalls of the gate trenches merge into the bottom of the gate trenches). Moreover, due to the difference in permittivity between silicon carbide and silicon oxide, the electric field in a silicon oxide gate oxide layer may be about 2.6 times higher than the electric field in the silicon carbide semiconductor layer structure adjacent the gate oxide layer. Breakdown of the silicon oxide occurs when the electric field reaches a critical level. In order to avoid such breakdown, power MOSFETs may be operated with the drain voltage at lower levels during reverse blocking operation to ensure that the electrical field does not reach a level that will result in breakdown. In other words, the voltage rating of a power MOSFET may be set to ensure that premature gate oxide breakdown will not occur.

So-called "trench shielding regions" (also called "trench shields" or "bottom shields") are often provided underneath the gate trenches of gate trench power MOSFETs in order to reduce the electric field levels in the gate oxide layer during reverse blocking operation. These trench shielding regions are formed by doping the portions of the semiconductor layer structure underneath the gate trenches with dopants having the same conductivity type as the dopants included in the channel regions of the device. The trench shielding regions are typically formed via one or more ion implantation processes in which p-type dopant ions (for an n-type MOSFET) are implanted through the bottom surfaces of the gate trenches. The trench shielding regions may, for example, extend downwardly 0.5 to 1.0 microns or more from the bottoms of the gate trenches into the semiconductor layer structure of the device, and are moderately to highly doped regions. The trench shielding regions are electrically connected to the source terminal of the MOSFET by p-type trench shielding region connection patterns. These trench shielding connection patterns may be in and/or outside the active region of the device.

More recently, gate trench power MOSFETs have been suggested that include additional shielding regions that are referred to as "support shields." The support shields are formed in the semiconductor layer structure between adjacent gate trenches and, like the trench shielding regions, may comprise highly doped semiconductor regions having the same conductivity type as the channel regions of the MOSFET. The support shields may, for example, extend to the same depth in the semiconductor layer structure as the trench shielding regions and may be formed by a high-energy ion implantation process. The support shields may directly connect to the source metallization in the active region of the device.

While adding support shields to the design of a gate trench power semiconductor device may provide increased protection to the gate oxide layer, the support shields may reduce the "pitch" of the device, as it may be necessary to increase the spacing between adjacent gate trenches to make room for the support shields. Adding support shields to a device also typically adds several additional processing steps (e.g., masking, ion implantation and/or mask removal steps), which increases fabrication costs. Thus, there are tradeoffs involved in adding support shields to a gate trench power semiconductor device.

Pursuant to embodiments of the present invention, gate trench silicon carbide power semiconductor devices are provided that have improved support shield designs. For example, in some embodiments, gate trench silicon carbide power semiconductor devices are provided that include relatively shallow support shield trenches that are formed in the upper surface of the semiconductor layer structure. The well contact regions of the MOSFET (which typically are a more highly-doped portion of the p-well) are formed so that at least a portion of each well contact region is positioned below a respective one of the support shield trenches. With this configuration, at least a portion of each well contact region may be recessed below the top surface of the semiconductor layer structure. The support shields are positioned below the respective well contact regions. The ion implantation process used to form the support shields may be performed through the support shield trenches, which allows a lower energy ion implantation process to be used. This can reduce the damage to the semiconductor layer structure and the amount of straggle. Moreover, since the well contact regions are at least partly recessed below the upper surface of the semiconductor layer structure, the source metallization of the MOSFET may directly contact both the upper and side surfaces of the source regions of the MOSFET. This arrangement acts to increase the contact area between the source metallization and the source regions. Since the lateral width of the source regions is typically specified to ensure a sufficiently low resistance connection between the source metallization and the source regions, having the source metallization directly contact both the upper and side surfaces of the source regions allows the sufficiently low resistance connection to be established while reducing the lateral widths of the source regions. Thus, the above design allows the pitch of the device to be reduced without any corresponding reduction in performance.

Pursuant to further embodiments of the present invention, gate trench power semiconductor devices are provided that have deep support shield trenches formed in the semiconductor layer structure. The support shield trenches may extend deeper into the semiconductor layer structure than the gate trenches and, in some embodiments, the support shield trenches may even extend deeper into the semiconductor layer structure than the trench shielding regions that are formed beneath the gate trenches. The support shield trenches may be filled with a conductive material other than silicon carbide such as, for example, doped polysilicon, nickel oxide or a metal that forms a Schottky contact with silicon carbide. The conductive material in the support shield trench forms a support shield. These gate trench power semiconductor devices may further include well contact regions which may comprise highly doped regions in the semiconductor layer structure that have the same conductivity type as the channel regions. These well contact regions may directly contact the support shields to provide a low resistance contact between the source metallization and the support shield. The well contact regions may also extend deeper into the semiconductor layer than the well region and, in some embodiments, may even extend as deep as or even deeper than the gate trenches so that the well contact region may also act to shield the gate oxide layer from high electric field values during reverse blocking operation.

Pursuant to still further embodiments of the present invention, gate trench power semiconductor devices are provided that have deep support shields formed in the semiconductor layer structure, and trenches are formed in the respective deep support shields. The trenches may be filled with the source metallization or another conductive material such as, for example, p-type polysilicon. The deep support shields may make a low resistance contact to the conductive material filling the respective trenches. The trenches may extend to the same depth as the gate trenches or to a greater depth than the gate trenches into the semiconductor layer structure in some embodiments. The trenches may be formed after the gate trenches in some embodiments.

Pursuant to some specific embodiments of the present invention, semiconductor devices such as MOSFETs or IGBTs are provided that comprise a silicon carbide based semiconductor layer structure that includes a drift layer having a first conductivity type, a gate trench that extends to a first depth into an upper surface of the semiconductor layer structure, a gate electrode in the gate trench, a support shield trench that extends to a second depth into the upper surface of the semiconductor layer structure, where the second depth is less than the first depth, and a source metallization layer on the upper surface of the semiconductor layer structure and extending into the support shield trench.

The semiconductor layer structure may further comprise a well contact region having a second conductivity type underneath the support shield trench, and may also comprise a support shield having the second conductivity type underneath the well contact region. The source metallization layer may directly contact the well contact region and the well contact region may directly contact the support shield. The semiconductor layer structure may also comprise a trench shield having the second conductivity type underneath the gate trench. The support shield may extend farther downwardly into the semiconductor layer structure than does the trench shield.

In some embodiments, the semiconductor layer structure may further comprise a well region having the second conductivity type on an upper surface of the drift layer and a source region having the first conductivity type on an upper surface of the well region. In such embodiments, the source metallization layer in the support shield trench may directly contact a side surface of a source region and an upper surface of the well contact region. The well contact region may have a first doping concentration of second conductivity type dopants that is at least an order of magnitude greater than a second doping concentration of second conductivity type dopants of the well region and/or is at least an order of magnitude greater than a third doping concentration of second conductivity type dopants of the support shield.

Pursuant to further embodiments of the present invention, semiconductor devices such as MOSFETs or IGBTs are provided that comprise a silicon carbide based semiconductor layer structure that comprises a drift layer having a first conductivity type, a well region having the second conductivity type on an upper surface of the drift layer, a source region having the first conductivity type on an upper surface of the well region, a well contact region having the second conductivity type in the well region, and a support shield having the second conductivity type underneath the well contact region. An upper surface of the well contact region is recessed below an upper surface of the source region. The support shield extends into the drift layer. A gate trench is formed in an upper surface of the semiconductor layer structure, and a gate electrode is provided in the gate trench. A support shield trench is also provided in the upper surface of the semiconductor layer structure, and a source metallization layer extends into the support shield trench.

Pursuant to additional embodiments of the present invention, semiconductor devices are provided that each include a plurality of unit cell transistors. These semiconductor devices comprise a silicon carbide based semiconductor layer structure that comprises a drift layer having a first conductivity type, a well region having a second conductivity type on an upper surface of the drift layer, a source region having the first conductivity type on an upper surface of the well region, and a well contact region having the second conductivity type in the well region, the well contact region being a portion of the well region that has a higher dopant concentration. An upper surface of the well contact region is recessed below an upper surface of the source region. A gate trench extends to a first depth into an upper surface of the semiconductor layer structure, and a source metallization layer extends in between source regions of adjacent ones of the unit cell transistors to directly contact the well contact region.

Pursuant to yet additional embodiments of the present invention, semiconductor devices are provided that include a silicon carbide based semiconductor layer structure. The semiconductor layer structure comprises a drift layer having a first conductivity type, a well region having the second conductivity type on an upper surface of the drift layer, a source region having the first conductivity type on an upper surface of the well region, and a well contact region having the second conductivity type in the well region, the well contact region being a portion of the well region that has a higher dopant concentration. These devices further comprise a source metallization layer that contacts upper and side surfaces of the source regions and contacts an upper surface of the well contact region.

Pursuant to still further embodiments of the present invention, semiconductor devices are provided that comprise a silicon carbide based semiconductor layer structure that comprises a drift layer having a first conductivity type, a well region having the second conductivity type on an upper surface of the drift layer, and a well contact region having the second conductivity type extending downwardly through the well region and into the drift layer. A gate trench is provided in an upper surface of the semiconductor layer structure, and a gate electrode is provided in the gate trench. A support shield trench extends through the well contact region, the support shield trench extending farther downwardly into the semiconductor layer structure than the well contact region. A support shield is provided in the support shield trench.

Pursuant to other embodiments of the present invention, semiconductor devices are provided that comprise a silicon carbide based semiconductor layer structure that comprises a drift layer having a first conductivity type, a well region having the second conductivity type on an upper surface of the drift layer, a well contact region having the second conductivity type extending downwardly through the well region and into the drift layer, a source region having the first conductivity type on an upper surface of the well region, and a support shield having the second conductivity type extending downwardly into the drift layer. A gate trench is provided in an upper surface of the semiconductor layer structure, and a gate electrode is provided in the gate trench. These devices further comprise a trench that extends into the support shield, and a conductive material other than silicon carbide in the trench.

Embodiments of the present invention will now be described in more detail with reference to FIGS. 2A-11. It will be appreciated that features of the different embodiments disclosed herein may be combined in any way to provide many additional embodiments. Thus, it will be appreciated that various features of the present invention are described below with respect to specific examples, but that these features may be added to other embodiments and/or used in place of example features of other embodiments to provide many additional embodiments. Thus, the present invention should be understood to encompass these different combinations. Additionally, while the example embodiments focus on MOSFET implementations, it will be appreciated that the same techniques may be used in other gate trench power semiconductor devices such as insulated gate bipolar transistors (IGBTs), gate controlled thyristors and the like.

Figure 2A:
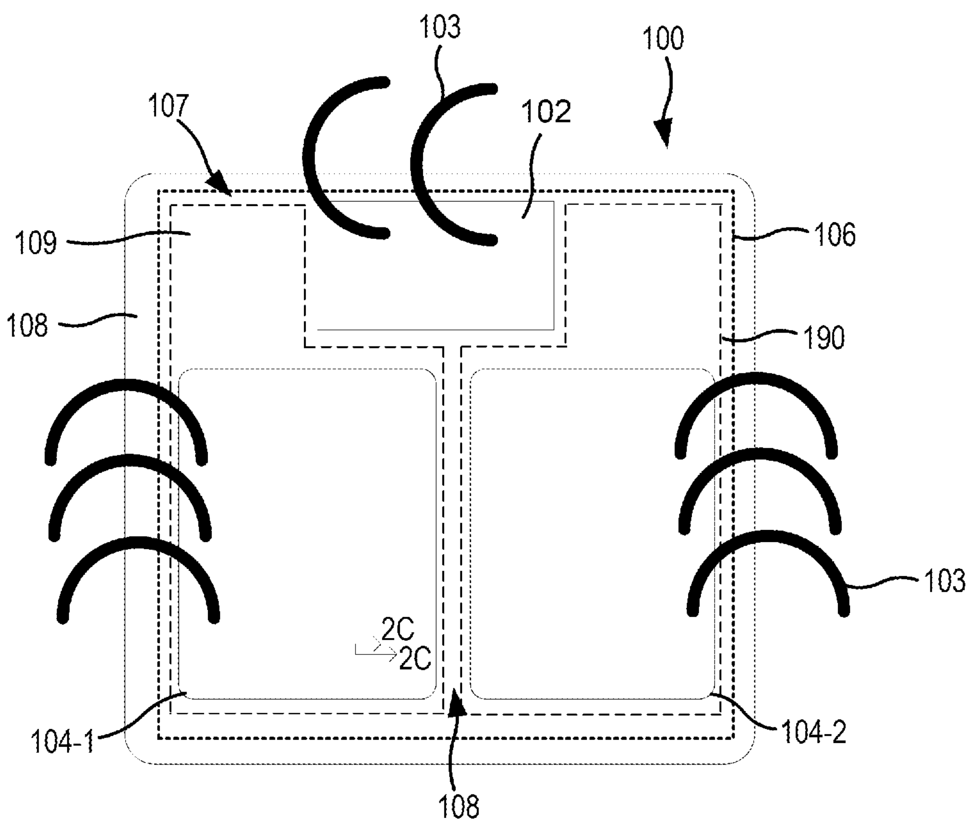
FIG. 2A is a schematic top view of a gate trench silicon carbide power MOSFET according to certain embodiments of the present invention.
Figure 2B:
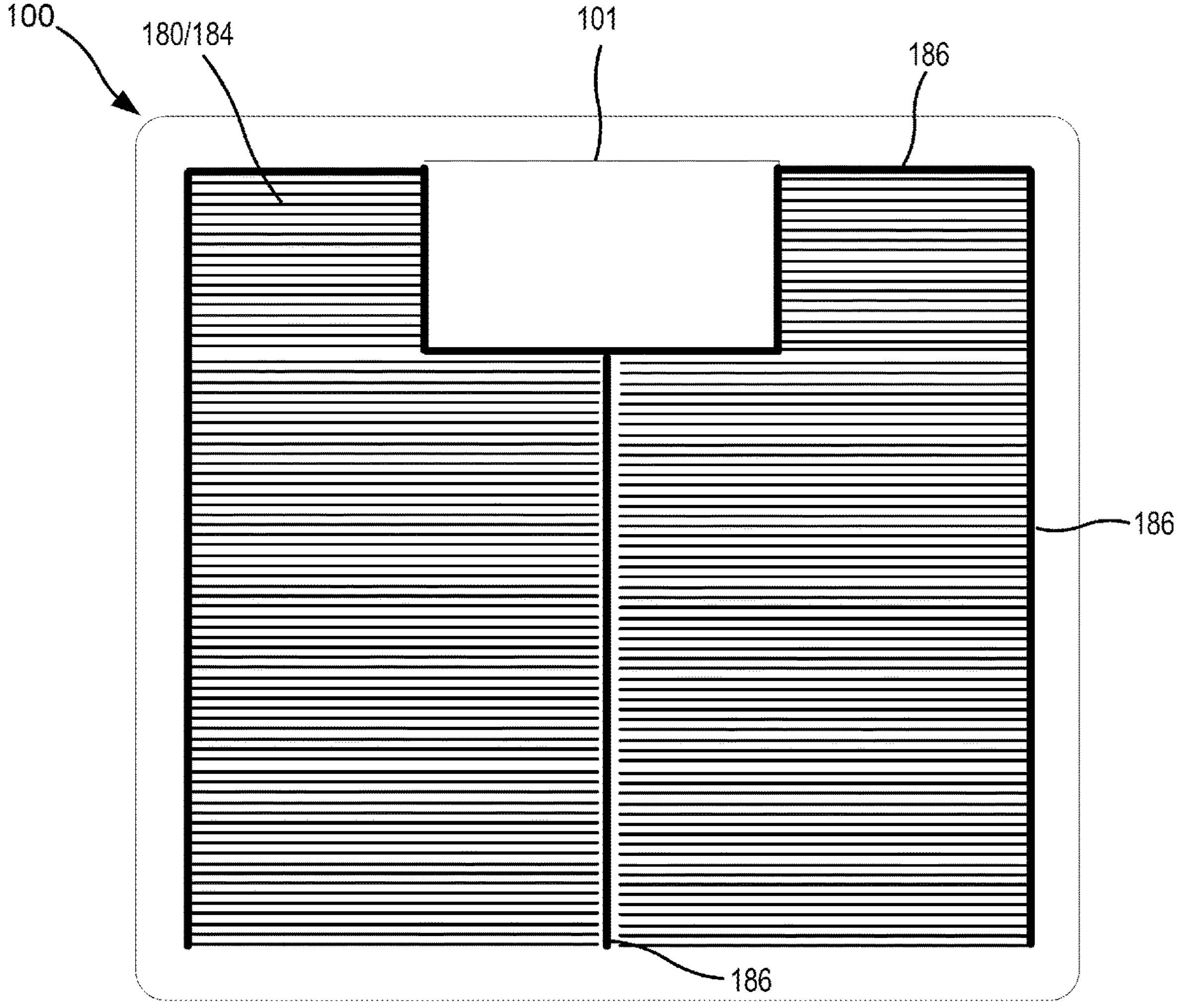
FIG. 2B is a schematic top view of the gate trench silicon carbide power MOSFET of FIG. 2A with various of the upper metal and dielectric layers removed.
Figure 2C:
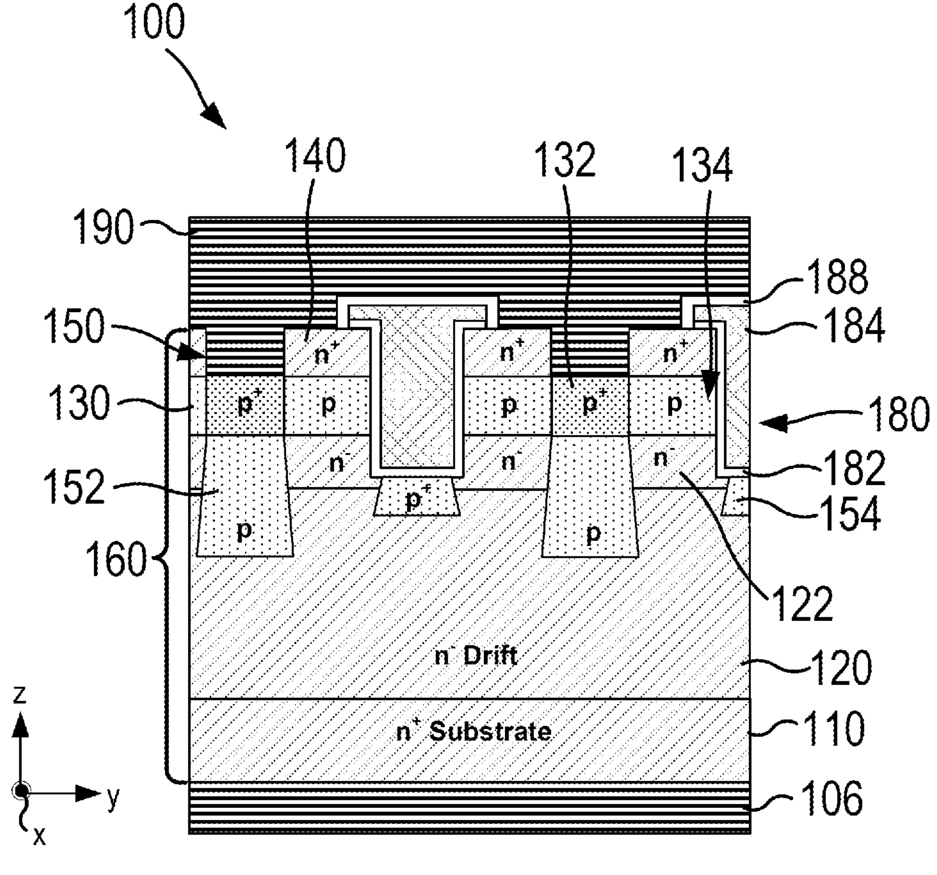
FIG. 2C is a schematic cross-sectional view of the gate trench silicon carbide power MOSFET of FIGS. 2A-2B that is taken along line 2C-2C of FIG. 2A.

FIG. 2A is a schematic top view of a gate trench silicon carbide power MOSFET 100 according to certain embodiments of the present invention. FIG. 2B is a schematic plan view of the power MOSFET 100 with various top-side metal and dielectric layers thereof omitted to show the gate electrodes and gate buses. FIG. 2C is a schematic cross-sectional view of a unit cell of the gate trench silicon carbide power MOSFET 100 that is taken along line 2C-2C of FIG. 2A. It will be appreciated that the thicknesses of various of the layers and regions in FIGS. 2A-2C are not necessarily drawn to scale. The same is true with respect to the other figures included in this application.

The power MOSFET 100 includes a semiconductor layer structure 160 (see FIG. 2C) that comprises one or more semiconductor substrates and/or layers. At least one of the semiconductor layers in the semiconductor layer structure 160 may be a silicon carbide layer. Various metal and/or dielectric layers are formed on either side of the semiconductor layer structure 160 and embedded in the semiconductor layer structure 160.

As shown in FIG. 2A, the top-side metal layers include a gate bond pad 102 and one or more source bond pads 104-1, 104-2 that are formed on the upper side of the semiconductor layer structure 160. A metal drain pad 106 (shown as a dashed line in FIG. 2A since it is not visible in FIG. 2A) is provided on the bottom side of the power MOSFET 100. The gate bond pad 102, the source bond pads 104 and the drain pad 106 form the respective gate, source and drain terminals of power MOSFET 100. The gate and source pads 102, 104 may each be formed of a metal, such as aluminum, that bond wires can be readily attached to via conventional techniques such as thermo-compression or soldering. The drain pad 106 may likewise be a metal pad. A protective layer 109 such as a polyimide layer may cover the entire upper surface of power MOSFET 100 except for the gate and source pads 102, 104.

Still referring to FIG. 2A, the power MOSFET 100 includes a source metallization 190 (indicated by the dashed boxes in FIG. 2A) that electrically connects certain regions of the semiconductor layer structure 160 to the source bond pads 104-1, 104-2. The source bond pads 104-1, 104-2 may be portions of the source metallization 190 that are exposed through openings in the protective layer 109 or may be separate metal layers. The source metallization 190 may generally overlie or correspond to an "active region" 107 of the power MOSFET 100 where the unit cell transistors are located. An inactive region 108 of power MOSFET 100 surrounds the active region 107. The inactive region 108 may include a termination region that extends around the periphery of the MOSFET 100 that includes guard rings, junction termination elements or other termination structures (not shown), a gate pad region that underlies the gate pad 102, and gate bus regions (discussed below).

Bond wires 103 are shown in FIG. 2A that may be used to connect the gate bond pad 102 and the source bond pads 104 to external circuits or the like. The drain pad 106 on the bottom side of power MOSFET 100 may be connected to an external circuit through, for example, an underlying submount (not shown).

FIG. 2B is another plan view of power MOSFET 100 with the gate and source bond pads 102, 104, the polymide layer 109, the source metallization 190 and various other metal and dielectric layers removed to show the gate electrodes 184 that are formed in the gate trenches 180 in the semiconductor layer structure 160. A patterned field oxide layer (not shown) is formed on the semiconductor layer structure 160 in the inactive region 108 of the MOSFET 100. The field oxide layer may be a relatively thick oxide layer (e.g., ten to twenty times thicker than the gate oxide layers that are discussed below). A polysilicon layer 101 may be formed on the field oxide layer and may be formed in the region where the gate bond pad 102 is formed so that the gate bond pad 102 vertically overlaps the field oxide layer and the polysilicon layer 101. As used herein, two elements of a semiconductor device are considered to "vertically overlap" if an axis that is perpendicular to the major surfaces of a semiconductor layer structure of the semiconductor device intersects both elements. One or more gate buses 186 are provided that extend around the periphery of the active region 107. The field oxide layer typically runs underneath each gate bus 186 as well as underlying the gate bond pad 102. The gate buses 186 are electrically connected to the gate bond pad 102, often through gate resistors (not shown). A plurality of gate trenches 180 (see FIG. 2C) are formed throughout the active region 107. A gate electrode 184 is formed in each gate trench 180. In the depicted MOSFET 100, the gate electrodes 184 extend horizontally across the semiconductor layer structure 160. In other cases, the gate electrodes 184 may extend vertically across the semiconductor layer structure 160, both horizontally-extending and vertically-extending gate electrodes 184 can be provided to form a grid-like gate electrode structure, or annular hexagonal or other-shaped gate electrodes 184 may be used. The gate electrodes 184 may be connected to the gate pad 102 through the gate buses 186. The gate electrodes 184 may comprise, for example, a doped polysilicon pattern. The gate buses 186 may comprise polysilicon and/or metal structures in example embodiments and typically are in the inactive region 108 of power MOSFET 100.

FIG. 2C is a schematic cross-sectional view taken along line 2C-2C of FIG. 2A that illustrates about one and a half unit cells of the power MOSFET 100. As shown in FIG. 2C, the power MOSFET 100 includes an n-type silicon carbide semiconductor substrate 110. The substrate 110 may comprise, for example, a single crystal 4H silicon carbide semiconductor substrate that is heavily-doped with n-type impurities (i.e., an n+ silicon carbide substrate). The impurities may comprise, for example, nitrogen or phosphorous. In example embodiments, the n-type substrate 110 may have a doping concentration of, for example, between $1\times10^{18}$ atoms/cm$^3$ and $1\times10^{21}$ atoms/cm$^3$, although other doping concentrations may be used. The substrate 110 may be relatively thick in some embodiments (e.g., 20-100 microns or more). It should be noted that while the substrate 110 is depicted as a relatively thin layer, this is done to allow enlarging the thickness of other layers and regions in FIG. 2C, and it will be appreciated that the substrate 110 will typically be much thicker than shown. The thickness of various other layers of power MOSFET 100 likewise may not be shown to scale in order to allow other portions of the devices to be enlarged in the figures.

A lightly-doped n-type (n-) silicon carbide drift layer 120 (which also may be referred to herein as a drift region 120) is provided on an upper surface of the substrate 110. Typically, the drift layer 120 is formed via an epitaxial growth process and is doped during growth. The n-type drift region 120 may have, for example, a doping concentration of $5\times10^{15}$ to $5\times10^{17}$ dopants/cm$^3$. The n-type drift region 120 may be a thick region, having a vertical height above the substrate 110 of, for example, 3-50 microns, and can be doped during growth. An upper portion of the n-type drift region 120 may optionally comprise an n-type current spreading layer 122 that is more heavily doped than the lower portion of the n-type drift region 120. If provided, the n-type current spreading layer 122 may have an n-type dopant concentration of, for example, $5\times10^{16}$ to $1\times10^{18}$. Herein, the n-type current spreading layer 122, if provided, is considered to be part of the drift region 120 and generally will not be referred to separately. The n-type current spreading layer 122, if provided, may be doped during epitaxial growth or via a later ion implantation step The drift layer 120 and the substrate 110 together act as a common drain region for the power MOSFET 100. The drain pad 106 is formed on the substrate 110 opposite the drift region 120.

Still referring to FIG. 2C, a moderately-doped (p) p-type silicon carbide well region 130 is formed on the upper surface of the n-type drift region 120 or in an upper portion of the n-type drift region 120 (i.e., the upper portion of the n-type drift region 120 is converted into the well region 130). The moderately-doped (p) p-type silicon carbide well region 130 may be formed either by epitaxial growth or by implanting p-type dopant ions into the upper portion of the n-type drift region 120 to convert the upper portion of the n-type drift layer into the p-type silicon carbide well region 130. In example embodiments, the moderately-doped p-type well region 130 may have a p-type dopant concentration of, for example, between $5\times10^{16}$ to $1\times10^{18}$.

Selected portions of the p-type well region 130 may be more heavily doped than the remainder of the well region 130 to form p-type well contact regions 132 within the well region 130. The p-type well contact regions 132 may have a p-type dopant concentration of, for example, between $1\times10^{18}$ to $1\times10^{22}$. In some embodiments, the p-type well contact regions 132 may have a p-type dopant concentration that is at least an order of magnitude higher than the p-type dopant concentration of the well region 130. In some embodiments, the p-type well contact regions 132 may have a p-type dopant concentration of, for example, between $1\times10^{19}$ to $1\times10^{21}$ or between $1\times10^{19}$ and $5\times10^{20}$.

Heavily-doped (n+) n-type silicon carbide source regions 140 may be formed on the p-type silicon carbide well region 130 or in upper portions of the p-type silicon carbide well region 130 (depending upon whether or not the p-type silicon carbide well region 130 extends to the surface of the semiconductor layer structure 160). The heavily-doped n-type silicon carbide source regions 140 may be formed by ion implantation. Each heavily-doped n-type silicon carbide source region 140 may have a doping concentration, for example, of between $1\times10^{19}$ atoms/cm$^3$ and $5\times10^{21}$ atoms/cm$^3$.

As is further shown in FIG. 2C, p-type support shields 152 and p-type trench shielding regions 154 are formed in the silicon carbide drift region 120. The p-type support shields 152 are formed underneath the p-type well contact regions 132 so that the upper surface of each support shield 152 directly contacts a lower surface of a respective one of the well contact regions 132. The p-type support shields 152 may be moderately or heavily doped (p+) silicon carbide regions. For example, each p-type support shield 152 may have a doping concentration between about $5\times10^{16}$ and $1\times10^{22}$. In other embodiments, each p-type support shield 152 may have a doping concentration between about $1\times10^{18}$ and $1\times10^{20}$, between about $1\times10^{19}$ and $1\times10^{20}$, between about $1\times10^{17}$ and $1\times10^{19}$, between about $1\times10^{17}$ and $1\times10^{20}$, or between about $1\times10^{18}$ and $1\times10^{21}$. In example embodiments, each p-type support shield 152 may extend to a depth of between 0.1 microns and 4.0 microns from the upper surface of the semiconductor layer structure 160. In other embodiments, the depth of each p-type support shield 152 may be between 1.0 and 3.0 microns, between 1.0 and 2.5 microns, between 1.5 and 3.0 microns, between 1.5 and 2.5 microns, or between 0.5 and 2.5 microns. Any of the above dopant concentration ranges for the p-type support shields 152 may be matched with any of the above-listed depths for the p-type support shields 152. The p-type support shields 152 may act to reduce the electric field levels that form in gate oxide layers (discussed below) during device reverse blocking operation, as will be discussed in greater detail below.

The p-type trench shielding regions 154 are formed underneath the respective gate trenches 180 and may extend underneath the respective gate trenches 180 for all or substantially all of the length of the gate trench 180. The p-type trench shielding regions 154 may be moderately or heavily doped ($p^+$) silicon carbide regions. For example, each p-type trench shielding region 154 may have a doping concentration between about $1\times10^{17}$ and $1\times10^{21}$. In other embodiments, each p-type trench shielding region 154 may have a doping concentration between about $1\times10^{18}$ and $1\times10^{20}$, between about $1\times10^{19}$ and $1\times10^{20}$, between about $1\times10^{17}$ and $1\times10^{20}$, or between about $1\times10^{18}$ and $1\times10^{21}$. In example embodiments, each p-type trench shielding region 154 may extend to a depth of between 0.5 and 3.0 microns from the upper surface of the semiconductor layer structure 160. In other embodiments, the depth of each p-type trench shielding region 154 may be between 1.0 and 3.0 microns, between 1.0 and 2.5 microns, between 1.5 and 3.0 microns, between 1.5 and 2.5 microns, or between 0.5 and 2.5 microns. Any of the above dopant concentrations may be matched with any of the above-listed depths for the p-type trench shielding regions 154. The p-type trench shielding regions 154 may act to reduce the electric field levels that form in gate oxide layers (discussed below) during device operation, as will be discussed in greater detail below. The p-type trench shielding regions 154 may be doped to have a higher p-type dopant concentration, a lower p-type dopant concentration, or approximately the same p-type dopant concentration as the p-type support shields 152.

While not shown in FIG. 2C, electrical connections are provided, in and/or outside of the active region 107, that electrically connect the p-type trench shielding regions 154 to the p-type silicon carbide well region 130. U.S. Pat. Nos. 9,887,287 and 11,610,991 each illustrate designs for p-type silicon carbide trench shield connection patterns that can be used to electrically connect p-type trench shielding regions to a p-type silicon carbide well region. Any of the p-type silicon carbide trench shield connection patterns disclosed in these patents (each of which is incorporated herein by reference) can be used to electrically connect the p-type trench shielding regions 154 to the p-type silicon carbide well region 130. Additionally or alternatively, the p-type trench shielding regions 154 may be directly connected to the source metallization 190 through p-type silicon carbide trench shield connection patterns that, for example, are formed in the gate trenches 180, as shown in U.S. Patent Publication No. 2022/0130998, the entire content of which is also incorporated herein by reference in its entirety The n-type silicon carbide substrate 110, the n-type silicon carbide drift layer 120 (including any current spreading layer 122), the p-type silicon carbide well region 130 (including the p-type well contact regions 132), the n-type silicon carbide source regions 140, the p-type silicon carbide support shields 152 and the p-type silicon carbide trench shielding regions 145 may together comprise the semiconductor layer structure 160 of the power MOSFET 100.

As noted above, a plurality of gate trenches 180 are formed in the upper portion of the semiconductor layer structure 160. While only one full gate trench 180 and a portion of a second gate trench 180 are shown in the cross-section of FIG. 2C, it will be appreciated from FIG. 2B that the MOSFET 100 may include a large number of gate trenches 180. Each gate trench 180 may extend along a longitudinal axis through the semiconductor layer structure 160, and the gate trenches 180 may extend in parallel to each other as shown best in FIG. 2B. It will be appreciated that the longitudinal axes of the gate trenches 180 extend into the page in the view of FIG. 2C. The gate trenches 180 may be formed via an etching process.

A gate oxide layer 182 is provided in each gate trench 180 to cover the sidewalls and bottom surface of the gate trench 180. In some embodiments, each gate oxide layer 182 may extend onto the upper surface of the semiconductor layer structure 160. Each gate oxide layer 182 may comprise, for example, a silicon oxide ($SiO_2$) pattern. The gate oxide layers 182 may or may not be connected to each other outside the view of FIG. 2C. The gate oxide layers 182 may be formed generally conformally within the respective gate trenches 180.

Figures 10A, 10B:
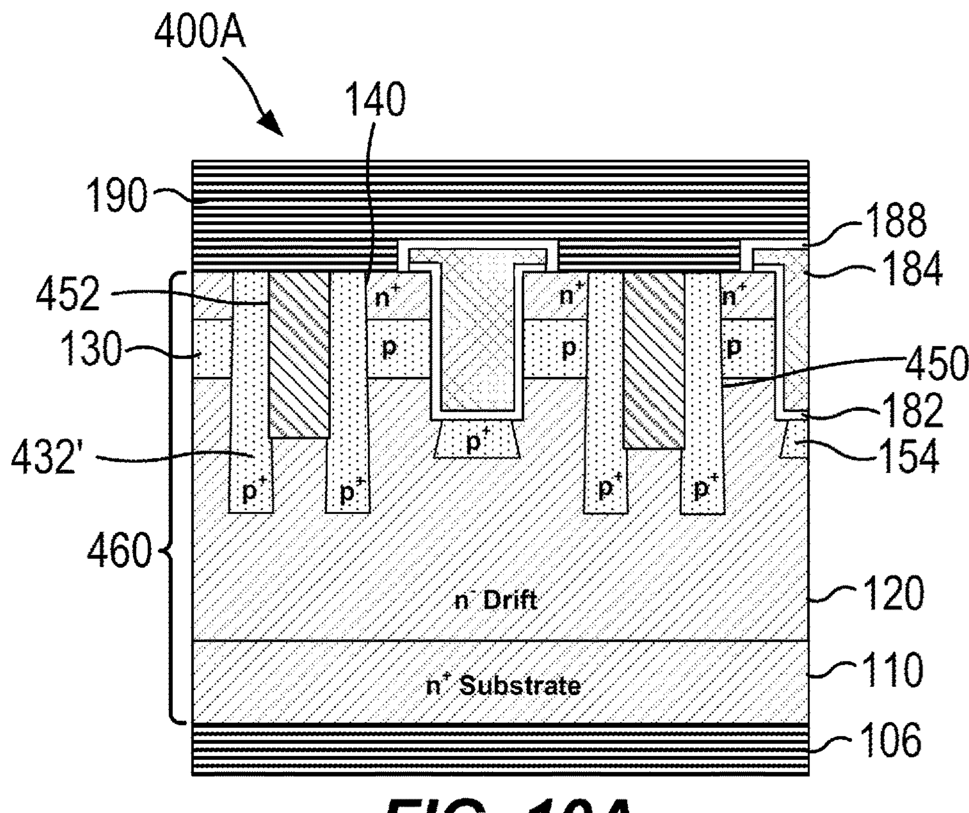
FIGS. 10A-10B are schematic cross-sectional views of modified versions of the gate trench silicon carbide power MOSFET of FIG. 9.

A gate electrode 184 is formed in each gate trench 180 on the gate oxide layer 182. The gate electrodes 184 may comprise conductive material such as a silicide (e.g., NiSi, TiSi, WSi, CoSi), doped polycrystalline silicon (poly-Si), and/or a stable conductor. Other suitable materials for the gate electrode include various metals such as Ti, Ta or W or metal nitrides such as TiN, TaN or WN. The gate oxide layers 182 may insulate the gate electrodes 184 from the semiconductor layer structure 160, thereby preventing the gate electrodes 184 from short circuiting to the semiconductor layer structure 160. Each gate electrode 184 may connect to one of the gate buses 186 (see FIG. 2B). In the depicted embodiment, the gate electrodes 184 extend above and onto the upper surface of the semiconductor layer structure 160, with the gate oxide layer 182 insulating the gate electrodes 184 from the semiconductor layer structure 160. In other embodiments, the gate electrodes 184 may be recessed so that the upper surface of each gate electrode 184 is below an upper surface of the semiconductor layer structure 160. It will be appreciated that each embodiment disclosed herein may have either of these gate electrode designs. FIG. 10B illustrates a power MOSFET having gate electrodes 184' that are recessed so that the upper surface of each gate electrode 184 is below an upper surface of the semiconductor layer structure 160.

Intermetal dielectric layers 188 are formed that cover each gate electrode 184. The intermetal dielectric layers 188 insulate the source metallization 190 from the gate electrodes 184.

Support shield trenches 150 are formed in the upper surface of the semiconductor layer structure 160. In the depicted embodiment, each support shield trenches 150 is formed between a respective pair of source regions 140 that are in between adjacent gate electrodes 184. Each support shield trench 150 may expose the sidewalls of one or two source regions 140. In the depicted embodiment, the support shield trenches 150 extend into the semiconductor layer structure 160 to the same depth as the bottom surfaces of the source regions 140 (which is the same depth as the top surface of the p-type well region 130). As will be discussed in more detail below, in other embodiments, the support shield trenches 150 may extend further or less deep into the semiconductor layer structure 160.

While the p-type well contact regions 132 are shown in FIG. 2C as being aligned with the support shields 152, it will be appreciated that embodiments of the present invention are not limited thereto. In other embodiments, the p-type well contact regions 132 may be offset to the left and right from the positions shown in FIG. 2C, and may only partially vertically overlap the support shields 152 or may not vertically overlap the support shields 152 at all. As shown in FIG. 4E (discussed below), in still other embodiments the p-type well contact regions 132 may be wider than the support shields 152, and they may be narrower than the support shields 152 in still other embodiments.

A source metallization 190 is formed on the upper surface of the semiconductor layer structure 160 and on the intermetal dielectric layers 188. Herein, the source metallization 190 may also be referred to as the "source contact." The source metallization 190 may comprise a single metal layer or multiple metal layers. Typically multiple metal layers are provided, as the source metallization 190 may include a single layer or multi-layer adhesion layer that contacts the semiconductor layer structure 160, one or more barrier layers, and a bulk metal layer (e.g., an aluminum layer). The source metallization 190 may also fill the support shield trenches 150 so that the source metallization 190 directly contacts the upper surface of the well contact regions 132 and both the upper surfaces and side surfaces of the source regions 140. Since the source metallization 190 directly contacts both the upper surfaces and side surfaces of the source regions 140, the resistance of the interface between the source metallization 190 and the source regions 140 is reduced as compared to a conventional power MOSFET. Typically, the lateral width of the portion of each source region 140 that directly contacts the source metallization 190 is set to achieve a sufficiently low resistance connection between source metallization 190 and the source regions 140. Since the source metallization 190 in the power MOSFET 100 contacts the side surfaces of the source regions 140, the lateral width of the source regions 140 may be reduced while still achieving a sufficiently low resistance connection between the source metallization 190 and the source regions 140.

As noted above, the source metallization 190 often includes one or more adhesion layers that help ensure that the source metallization 190 properly adheres to the semiconductor layer structure 160 and will not be prone to peeling off. Since the source metallization 190 extends into recesses in the semiconductor layer structure 160, improved adhesion between the source metallization 190 and the semiconductor layer structure 160 may be achieved. This may eliminate the need for adhesion layers in the source metallization 190 or provide a more robust device that is less prone to failure.

As will be discussed in more detail below, the p-type support shields 152 may be formed by ion implantation. In some embodiments, the p-type support shields 152 may be formed after the support shield trenches 150 are formed, which allows the ion implantation process that is used to form the p-type support shields 152 to be carried out so that the ions are implanted into the bottoms of the support shield trenches 150. This reduces the extent to which the ions must travel through the semiconductor layer structure 160 to achieve an implant at a desired depth, thereby allowing for use of a lower energy implant. As discussed above, lower energy implants may cause less damage to the silicon carbide lattice structure and may also result in less straggle, both of which may improve the performance of power MOSFET 100 as compared to a conventional power MOSFET.

The power MOSFET 100 may be turned on by applying a gate bias voltage that is above a threshold level to the gate pad 102. The gate bias voltage is transferred to the gate electrodes 184 via the gate buses 186 and creates conductive n-type inversion layers in the portions of the p-type silicon carbide well region 130 that are adjacent the gate trenches 180. These regions of the p-type silicon carbide well region 130 are referred to herein as channel regions 134 as current flows from the source regions 140 to the drift region 120 through these channel regions 134 during on-state operation. The channel regions 134 are vertically oriented (i.e., extend in the z direction) as the current flows downwardly from the source regions 140, through the channel regions 134 to the drift layer 120, substrate 110 and drain contact 106.

As discussed above, one common failure mechanism in power semiconductor devices such as power MOSFETs is device failure due to breakdown of the gate oxide layer. Since the lifetime (i.e., time until breakdown) of a gate oxide layer is a function of the intensity of the electric field in the gate oxide layer during device operation, one way to reduce the instances of device failure is to design the MOSFET to have reduced peak electric field values in the gate oxide layer.

During reverse blocking operation, the electric field extends upwardly from the bottom of the MOSFET 100. As such, strong electric fields may extend upwardly toward the lower portion of the gate oxide layers 182. The p-type silicon carbide trench shielding regions 154 act as a shield that reduces the electric field values directly underneath the gate trenches 180. The electric field, however, will tend to extend upwardly on both sides of each trench shielding region 154. As such, the electric field tends to be highest in the portions of the gate oxide layers 182 that are not directly protected by the trench shielding regions 154, such as the lower sidewalls and lower corners of each gate oxide layers 182. Moreover, electric field crowding effects occur in the lower corners of each gate oxide layer 182, further increasing the intensity of the electric field in this portion of each gate oxide layer 182. Thus, while the trench shielding regions 154 help reduce the electric field levels in the gate oxide layers 182, the lower corners of the gate oxide layers 182 are typically only partially protected, and these lower corners are the portions of the gate oxide layers 182 that are most susceptible to breakdown due to the electric field crowding effects.

The support shields 152 are provided to help further protect the lower corners of the gate oxide layers 182. The support shields 152, like the trench shielding regions 154, suppress the extent to which the electric field extends upwardly from the drain pad 106. Since the support shields 152 may be formed deeper into the semiconductor layer structure 160 (since they are formed by ion implantation into the support shield trenches 150), the support shields 152 may be very effective in reducing the electric field values in the lower corners of the gate oxide layers 182. Thus, the power MOSFET 100 may also exhibit improved reliability since the gate oxide layers 182 thereof may be less susceptible to breakdown.

FIGS. 3A-3F are schematic cross-sectional views illustrating a method of fabricating the gate trench silicon carbide power MOSFET 100 of FIGS. 2A-2C.

Figure 3A:
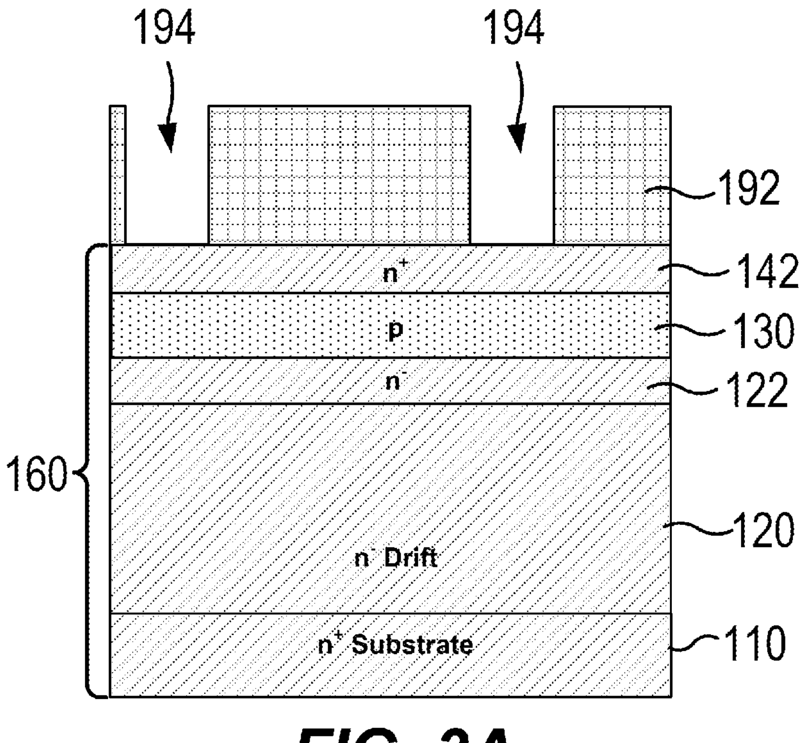
FIGS. 3A-3F are schematic cross-sectional views illustrating a method of fabricating the gate trench silicon carbide power MOSFET of FIGS. 2A-2C.

Referring to FIG. 3A, the n-type silicon carbide substrate 110 is provided. The lightly-doped (n) silicon carbide drift layer 120 is then formed on an upper surface of the substrate 110, typically via epitaxial growth. The n-type dopant concentration may be increased during the growth of the upper portion of the drift layer 120 to form the current spreading layer 122 in the upper portion of the drift layer 120. The epitaxial growth process may then continue (with the n-type dopant source left turned on or turned off) to grow the regions of the semiconductor layer structure 160 that will be turned into the p-type well region 130, the well contact regions 132 and the source regions 140.

Still referring to FIG. 3A, a first ion implantation process is performed to implant p-type ions into the upper portion of the semiconductor layer structure 160. The ion implantation process may be a buried process that primarily implants the p-type ions into the region above the current spreading layer 122 to form the p-type well region 130. Then, a second ion implantation process is performed to implant n-type ions into the upper portion of the semiconductor layer structure 160 to form an n-type source layer 142 above the p-well region 130. It will be appreciated that the first and second ion implantation steps may be performed in reverse order, and that the p-type well region 130 and/or the n-type source layer 142 may alternatively be formed by appropriately doping these regions during the epitaxial growth process. Thereafter, a first mask 192 such as, for example, an oxide mask is formed on the upper surface of the semiconductor layer structure 160 and is then patterned (e.g., using standard photolithography patterning techniques) to form openings 194 in the first mask 192 that expose selected portions of the semiconductor layer structure 160. The openings 194 may be positioned above locations in the semiconductor layer structure 160 in which the support shield trenches 150 are formed in a subsequent processing step.

Figure 3B:
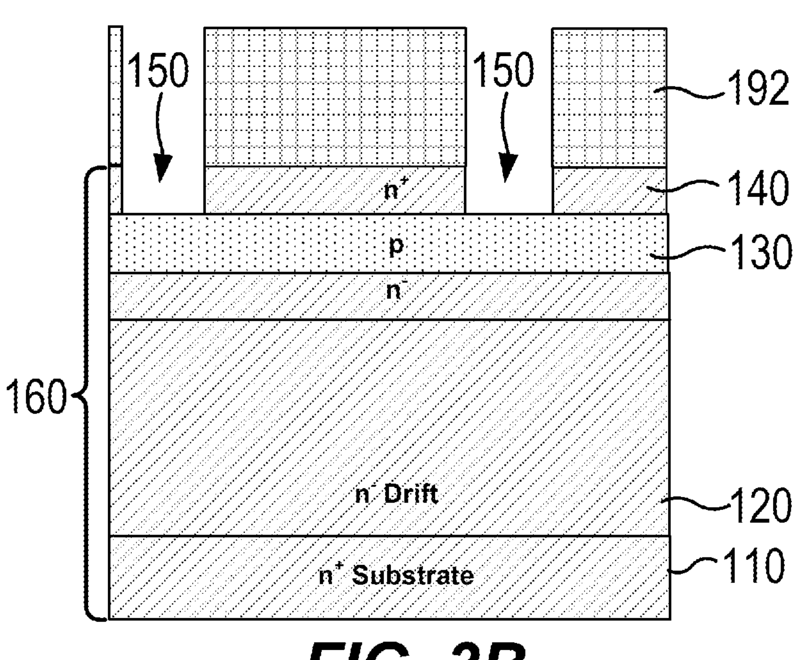

Next, referring to FIG. 3B, an etching process is performed to etch the exposed portions of the semiconductor layer structure 160 to form the support shield trenches 150. In the example embodiment depicted, the semiconductor layer structure 160 is etched to fully remove portions of the n-type source layer 142 to thereby convert the n-type source layer 142 into a plurality of spaced-apart n-type source regions 140 and to form the support shield trenches 150. The etching process also acts to expose selected portions of the p-type well region 130.

Figure 3C:
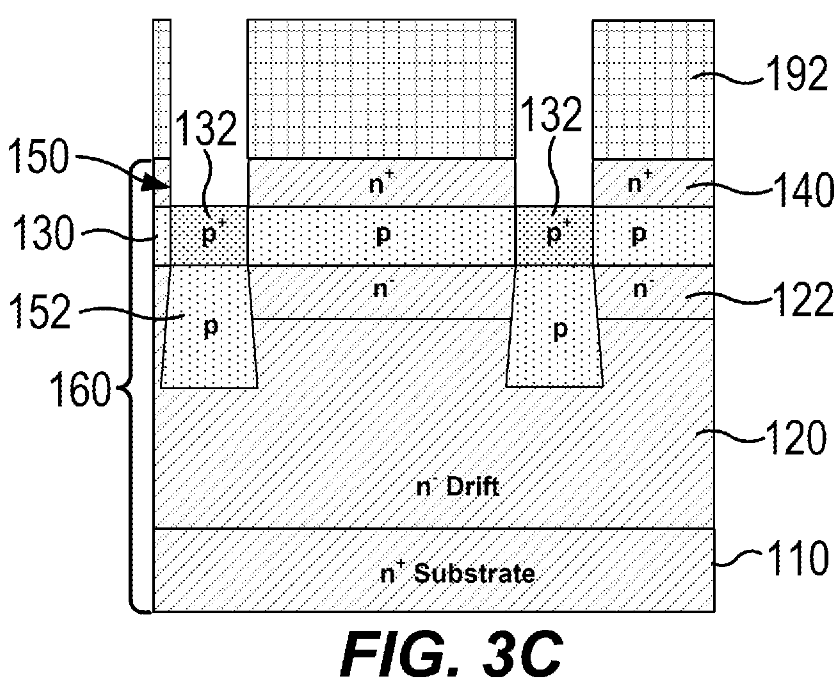

Referring to FIG. 3C, an ion implantation process is performed to implant p-type dopant ions into the portions of the semiconductor layer structure 160 that are exposed through the openings 194. A multi-step ion implantation process may be used in some embodiments. As shown in FIG. 3C, this ion implantation process may be used to convert selected portions of the moderately doped p-type well region 130 into the heavily doped p-type well contact regions 132 and to form the p-type support shields 152 in the current spreading layer 122 and the drift layer 120. The p-type support shields 152 may be deep p-type support shields 152 that extend to a significant depth into the semiconductor layer structure 160. In example embodiments, the bottoms of the p-type support shields 152 may be between 0.1 and 4.0 microns below the uppermost surface of the semiconductor layer structure 160. In some embodiments, the p-type support shields 152 may extend more deeply into the semiconductor layer structure 160 than the trench shielding regions 154 that are formed in a subsequent processing step. For example, the p-type support shields 152 may extend between 0.1 and 2.0 microns more deeply into the semiconductor layer structure 160 than the trench shielding regions 154 in some embodiments.

Figure 3D:
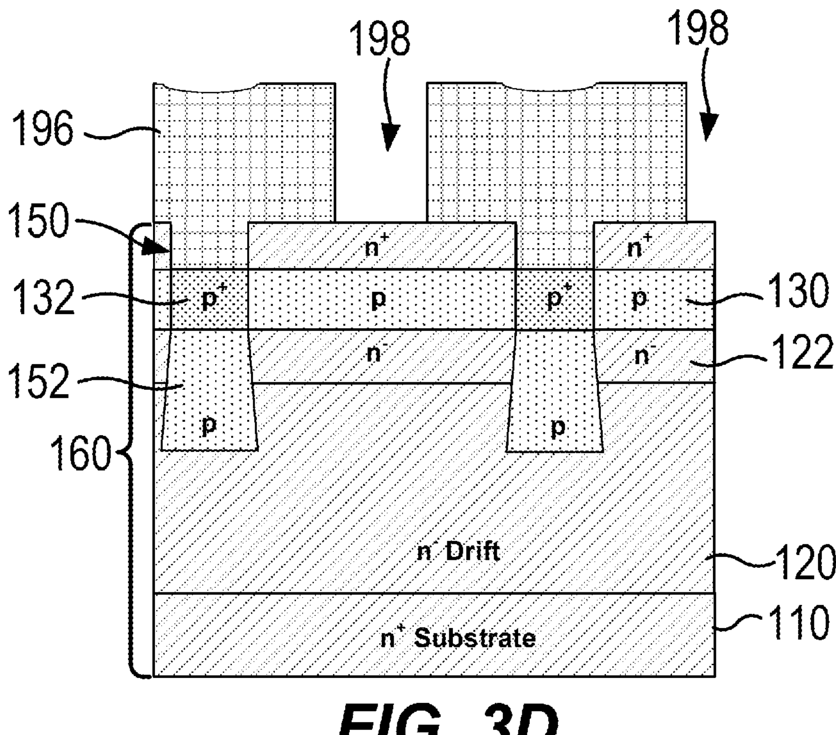

Referring to FIG. 3D, the first mask 192 may be removed and a second mask 196 (e.g., another oxide mask) may be formed to cover the semiconductor layer structure 160. The second mask 196 may then be patterned (e.g., using standard photolithography patterning techniques) to form openings 198 therein that expose selected portions of the semiconductor layer structure 160. The openings 198 may be positioned above locations in the semiconductor layer structure 160 in which the gate trenches 180 are formed in a subsequent processing step.

Figure 3E:
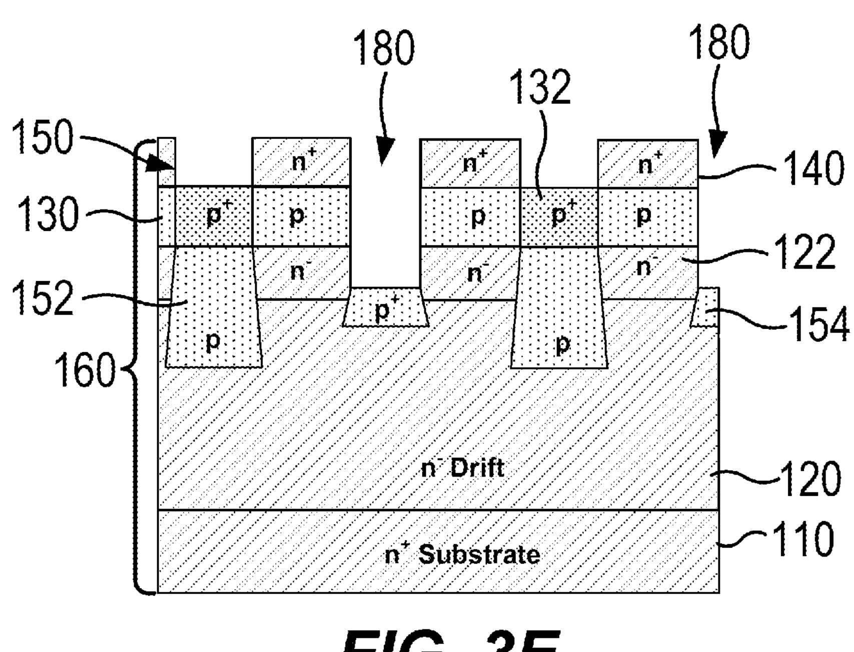

Referring to FIG. 3E, an etching process is performed to etch the exposed portions of the semiconductor layer structure 160 to form the gate trenches 180. As shown, in some embodiments the gate trenches 180 may extend farther into the semiconductor layer structure 160 than the well contact regions 132 but may not extend as far as the bottoms of the support shields 152. Next, an ion implantation process is performed to implant p-type dopant ions into the portions of the semiconductor layer structure 160 that are underneath the gate trenches 180 to form the trench shielding patterns 154. As discussed above, the trench shielding patterns 154 may not extend as deeply into the semiconductor layer structure 160 as the support shields 152.

Figure 3F:
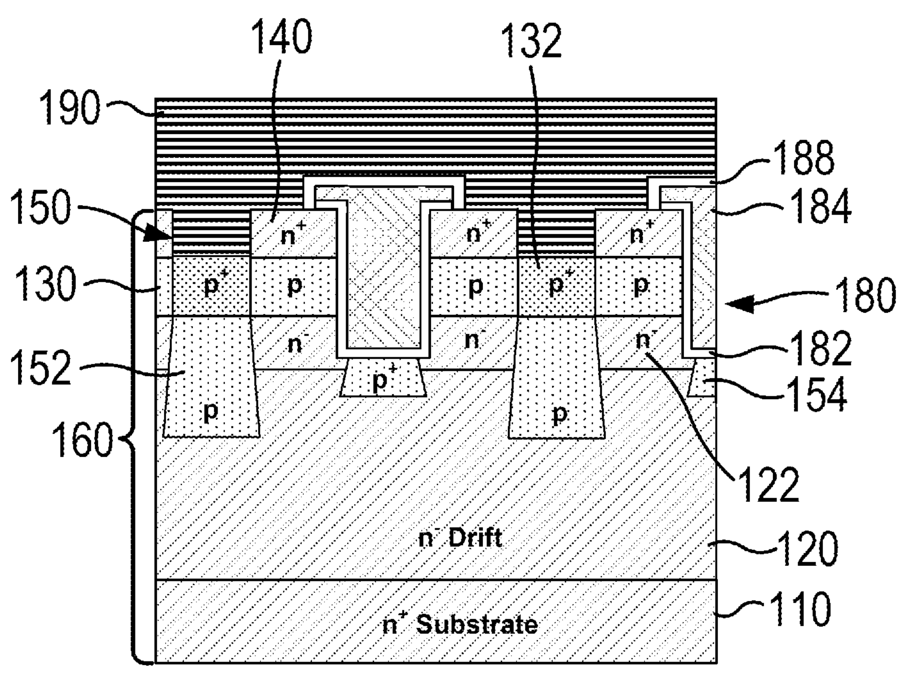

As shown in FIG. 3F, the gate oxide layers 182 and gate electrodes 184 may then be formed in the gate trenches 180, and the intermetal dielectric layers 188 are formed to cover the gate oxide layers 182 and gate electrodes 184. The source metallization layer 190 is then formed on the source regions 140, the intermetal dielectric layers 188 and the well contact regions 132. As shown, the source metallization 190 extends into the support shield trenches 150 to directly contact sidewalls of the source regions 140 and the upper surfaces of the well contact regions 132.

FIGS. 4A-4E are schematic cross-sectional views of gate trench silicon carbide power MOSFETs 100A-100E, respectively, that are modified versions of the gate trench silicon carbide power MOSFET 100. Gate trench silicon carbide power MOSFETs 100A-100E are almost identical to MOSFET 100, so the discussion below will focus solely on the difference between each of MOSFETs 100A-100E and MOSFET 100.

Figure 4A:
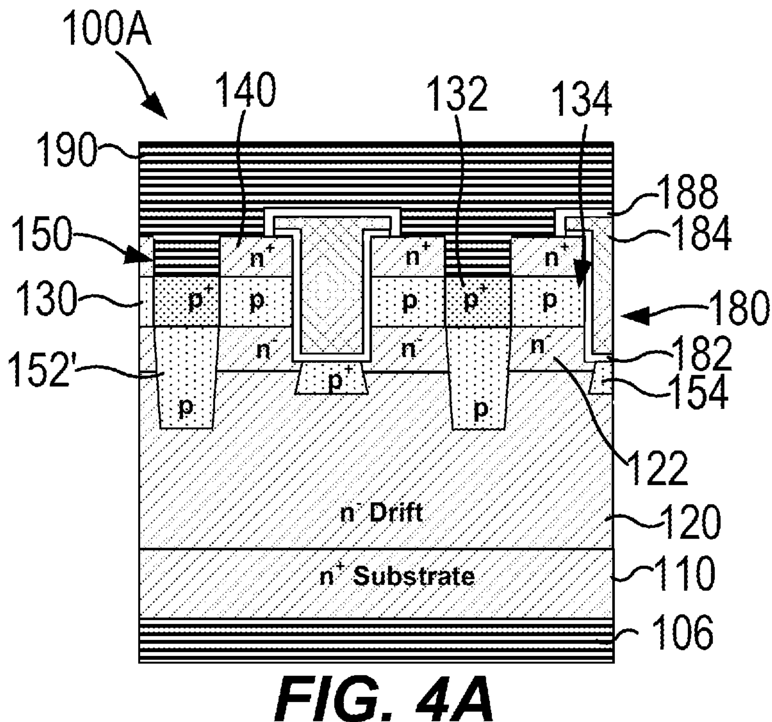
FIGS. 4A-4E are schematic cross-sectional views of five modified versions of the gate trench silicon carbide power MOSFET of FIGS. 2A-2B where the cross-sections are taken along line 2C-2C of FIG. 2A.

As can be seen by comparing FIG. 2C and FIG. 4A, the only difference between MOSFET 100 and MOSFET 100A is that MOSFET 100A includes p-type support shields 152' that are formed using channel ion implantation techniques, whereas the p-type support shields 152 that are provided in MOSFET 100 are formed using regular (and higher energy) ion implantation techniques. As discussed, for example, in U.S. Pat. No. 11,075,264, the entire content of which is incorporated herein by reference, channeled ion implantation refers to ion implantation where the dopant ions are implanted along certain crystallographic axes in silicon carbide where channels are provided, allowing the dopants to be implanted at deeper depths while using lower implantation energies (which advantageously reduces damage to the silicon carbide from the implantation and which also reduces scattering of the dopant ions to unintended locations in the crystal lattice). As shown in FIG. 4A, since channeled ion implantation is used, the shapes of the p-type support shields 152' in MOSFET 100A differ from the shapes of the p-type support shields 152 in MOSFET 100, with the width of p-type support shields 152 increasing as it comes closer to the substrate 110 while the width of the p-type support shields 152' may remain relatively constant with depth (not shown) or even getting narrower as it comes closer to substrate 110 as shown in FIG. 4A. The narrow p-type support shields 152' may help lower the on-state resistance of MOSFET 100A as compared to MOSFET 100.

Figure 4B:
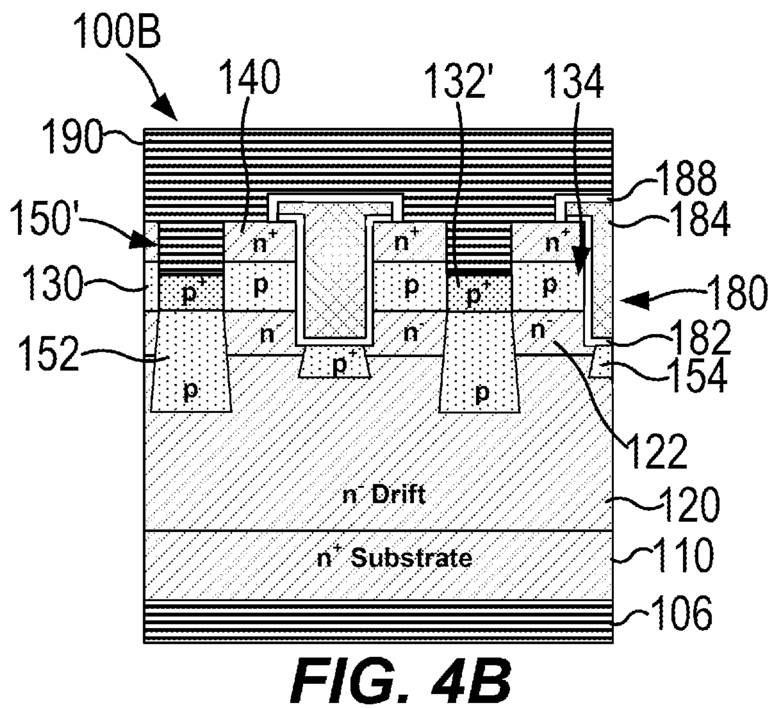

As can be seen by comparing FIG. 2C and FIG. 4B, the only difference between MOSFET 100 and MOSFET 100B is that MOSFET 100B includes deeper support shield trenches 150' that extend all the way through the source layer 142 and into the p-type well region 130. As a result, the thickness of the p-type well contact regions 132' may be reduced.

Figure 4C:
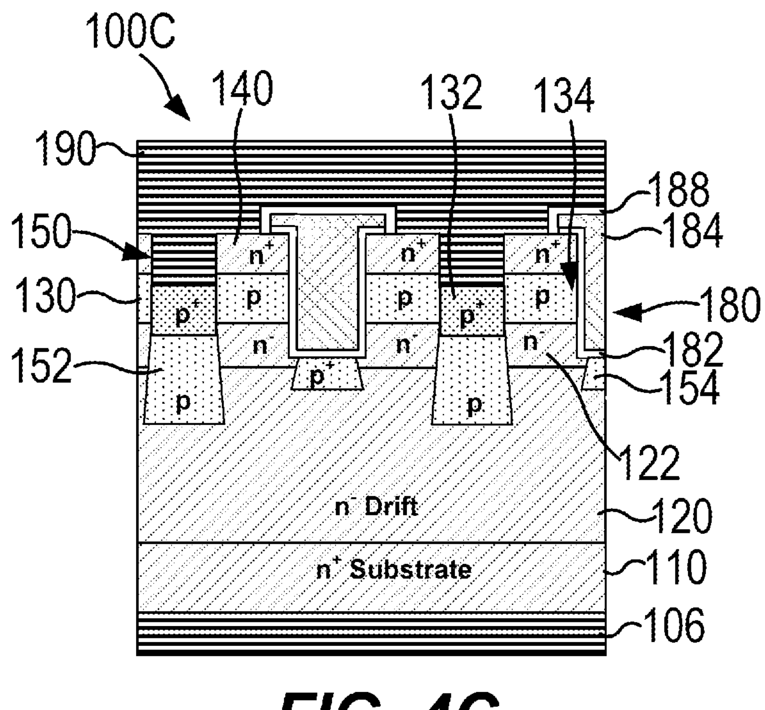

Alternatively, the thickness of the p-type well contact regions 132' can be kept the same as in the MOSFET 100 of FIG. 2C so that the p-type well contact regions 132' extend into the current spreading layer 122, as shown in FIG. 4C. In fact, having the p-type well contact regions 132' extend into (or even through) the current spreading layer 122 as shown in FIG. 4C may advantageously help disable a parasitic n-p-n bipolar junction transistor that is formed in the semiconductor layer structure 160.

Figure 4D:
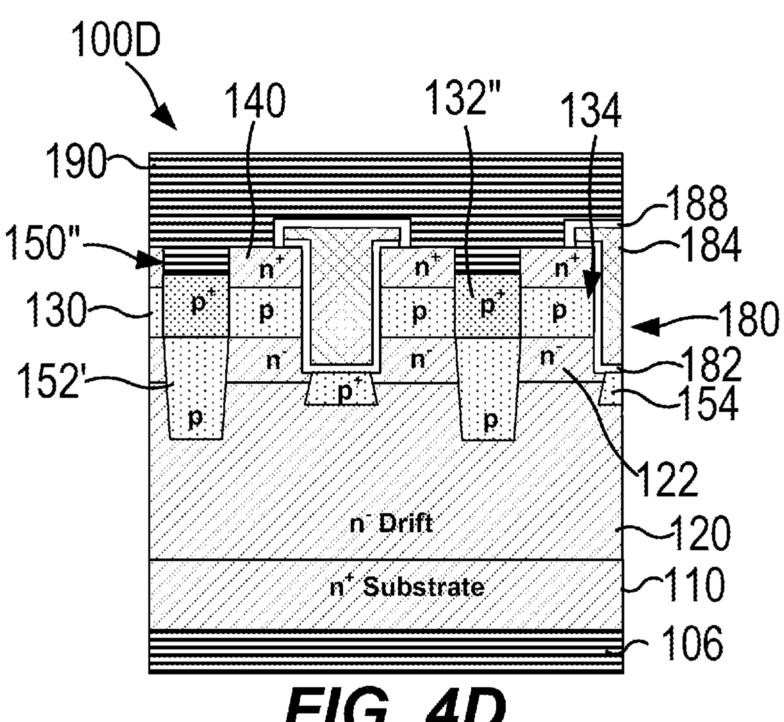
Figure 4E:
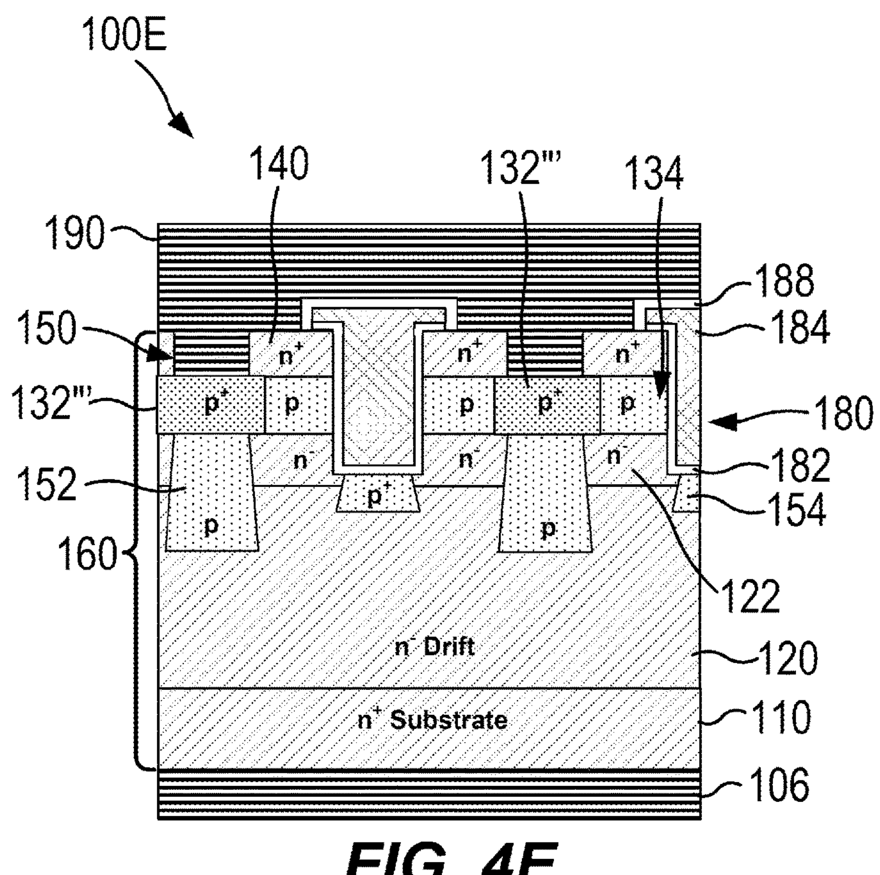

As can be seen by comparing FIG. 2C and FIG. 4D, the only difference between MOSFET 100 and MOSFET 100D is that MOSFET 100D includes shallower support shield trenches 150" that do not extend all the way through the source layer 142. As a result, the thickness of the p-type well contact regions 132" may be increased.

As can be seen by comparing FIG. 2C and FIG. 4E, the only difference between MOSFET 100 and MOSFET 100E is that MOSFET 100D includes wider p-type well contact regions 132" that are wider than the support shield trenches 150.

Figure 5:
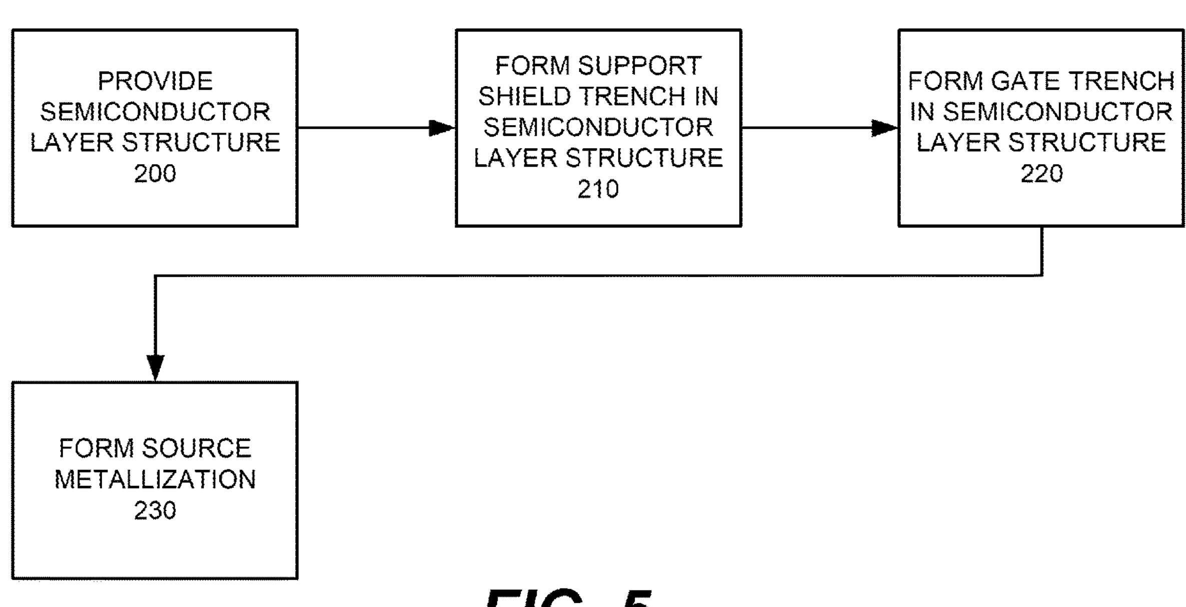
FIG. 5 is a flow chart illustrating a method of fabricating the gate trench silicon carbide power MOSFET of FIGS. 2A-2C.

FIG. 5 is a flow chart illustrating a method of forming the gate trench silicon carbide power MOSFET of FIGS. 2A-2C. As shown in FIG. 5, first a silicon carbide based semiconductor layer structure 160 is provided (Block 200). The semiconductor layer structure 160 includes a drift layer

120 having a first conductivity type, and may also include a well region 130 having a second conductivity type on an upper surface of the drift layer 120, and a source layer 142 having the first conductivity type on an upper surface of the well region 130.

Next, a support shield trench 150 is formed in the semiconductor layer structure 160. The support shield trench 150 may extend to a second depth into the upper surface of the semiconductor layer structure 160, where the second depth is less than the first depth (Block 210). Next, a plurality of gate trenches 180 are formed in the upper surface of the semiconductor layer structure 160 (Block 220). Each gate trench 180 may extend to a first depth into an upper surface of the semiconductor layer structure 160. Gate electrodes 184 are formed in the respective gate trenches 180. Gate oxide layers 182 may be formed in the gate trenches 180 prior to the gate electrodes 184 so that the gate oxide layers 182 are in between the gate electrodes 184 and the semiconductor layer structure so that the gate electrodes 184 are capacitively coupled to the semiconductor layer structure 160. Finally, a source metallization 190 is formed on the upper surface of the semiconductor layer structure 160 where the source metallization 190 extends into the support shield trench 150 (Block 230).

It will be appreciated that the processing steps discussed above with reference to FIGS. 3A-3F and 5 could be performed in different orders in further embodiments. As an example, the gate trenches 180 could be formed before the support shield trenches 150 in other embodiments. It will also be appreciated that some of the processing steps could be omitted in other embodiments, and/or that other processing steps may be added to the method.

Figure 6:
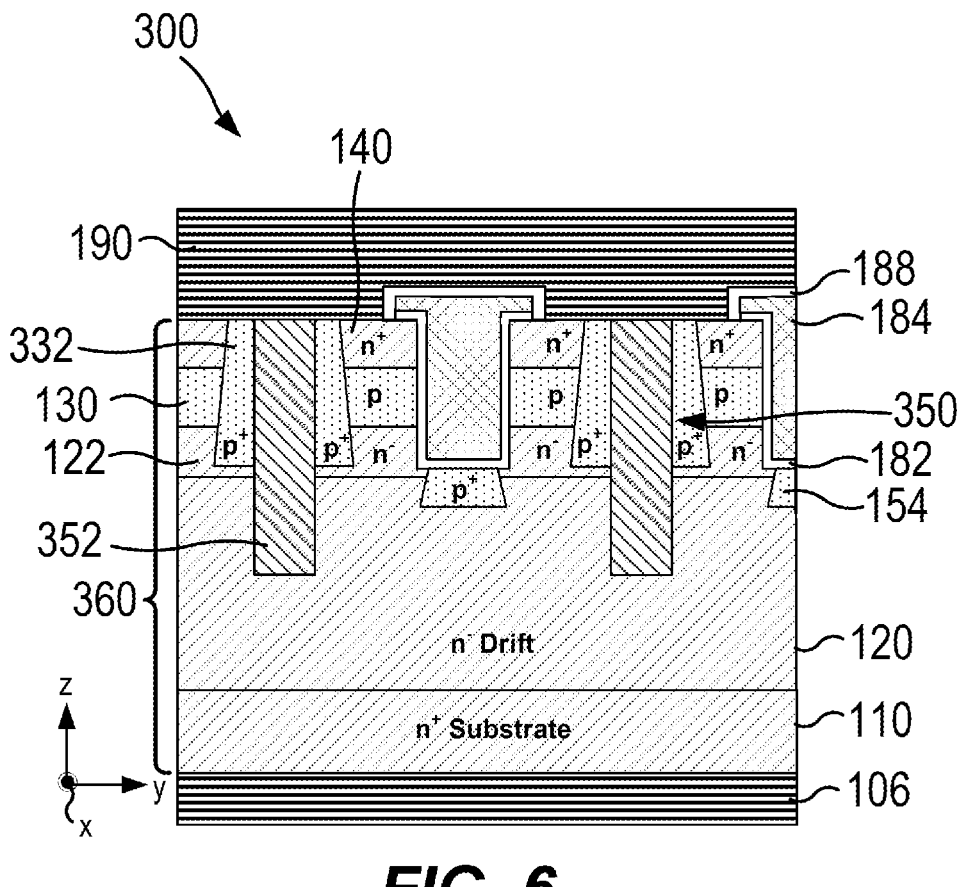
FIG. 6 is a schematic cross-sectional view of a gate trench silicon carbide power MOSFET according to further embodiments of the present invention.

FIG. 6 is a schematic cross-sectional view of a gate trench silicon carbide power MOSFET 300 according to further embodiments of the present invention. The gate trench silicon carbide power MOSFET 300 may be identical to the gate trench silicon carbide power MOSFET 100 when viewed in plan view, and hence FIG. 2A also accurately represents power MOSFET 300. The cross-section of FIG. 6 is also taken along the line 2C-2C of FIG. 2A and illustrates how power MOSFET 300 differs from power MOSFET 100. As many of the elements of power MOSFET 300 are the same as the corresponding elements of power MOSFET 100, the same reference numerals are used for those elements in FIGS. 2A-2C and FIG. 6. The description below will focus on the elements of power MOSFET 300 that differ from power MOSFET 100.

As can be seen by comparing FIGS. 2C and 6, power MOSFET 300 includes a drain contact 106, a substrate 110, a drift layer 120, a current spreading layer 122, a well region 130, source regions 140, gate shielding regions 154, gate trenches 180, gate oxide layers 182, gate electrodes 184 and intermetal dielectric layers 188 that may be identical (or substantially identical in the case of the well region 130 and the source regions 140) to the corresponding layers/regions in power MOSFET 100. Thus, additional description of these elements of MOSFET 100 will be omitted here.

Power MOSFET 300 further includes well contact regions 332, support shield trenches 350, and support shields 352 that are formed in the support shield trenches 350. The support shields 352 may serve the same function as the support shields 152 of power MOSFET 100, namely they act to reduce the strength of electrical fields that extend upwardly from the drain contact 106 into the semiconductor layer structure 360 during reverse blocking operation of MOSFET 300.

The p-type well contact regions 332 may, like the well contact regions 132 of MOSFET 100, provide a low resistance contact between the well region 130 and the source metallization 190. The well contact regions 332 may also assist in protecting the gate oxide layer 182 from high electric field values during reverse blocking operation since the well contact regions 332 extend deeply into the semiconductor layer structure 360. The well contact regions 332 have a p-type dopant concentration of, for example, between $5\times10^{16}$ to $1\times10^{22}$ or between $1\times10^{18}$ and $1\times10^{21}$. In some embodiments, the well contact regions 332 may have a p-type dopant concentration that is at least an order of magnitude higher than the p-type dopant concentration of the well region 130. The well contact regions 332 may extend deeper into the semiconductor layer structure 360 than the p-type well region 130, and may extend deeper into the semiconductor layer structure 360 than the well contact regions 132 of power MOSFET 100. In some embodiments, the well contact regions 332 may extend deeper into the semiconductor layer structure 360 than the gate trenches 180. In example embodiments, the well contact regions 332 may extend between 0.1 and 3.0 microns into the semiconductor layer structure 360.

The support shield trenches 350 may be formed through the well contact regions 332 so that the well contact regions 332 form a portion of the sidewalls of the support shield trenches 350. The support shield trenches 350 may be deep trenches that are formed into the upper surface of the semiconductor layer structure 360. In example embodiments, the support shield trenches 350 may extend between 0.1 and 4.0 microns or between 1.0 and 3.5 microns into the semiconductor layer structure 360. The support shield trenches 350 may extend deeper into the semiconductor layer structure 360 than the gate trenches 180 and, in some embodiments, the support shield trenches 350 may extend deeper into the semiconductor layer structure 360 than the trench shielding regions 154 that are formed beneath the gate trenches 180. The support shield trenches 350 may be filled with a conductive material 352 other than silicon carbide such as, for example, p-type polysilicon, nickel oxide or a metal that forms a Schottky contact with silicon carbide. The conductive materials 352 that fill the respective support shield trenches 350 form a plurality of support shields 352. The well contact regions 332 may comprise highly doped p-type regions that directly contact the respective support shields 352 and that form a low resistance contact to the support shields 352.

Having support shields 352 that are formed of a conductive material other than silicon carbide may have advantages in certain applications. For example, p-type silicon carbide, even when highly doped, may still have a relatively high resistance. Using other conductive materials having lower resistance levels may therefore provide a performance improvement. In addition, the non-silicon carbide conductive material used to form the support shields 352 may form a heterojunction diode with the drift layer 320 that may turn on at lower voltages, and hence reduce conduction losses. The MOSFET 300 may also have faster switching speeds than a comparable conventional device, and in avalanche breakdown the conductive material may provide a current path that does not extend through the normal channel region of the MOSFET.

FIGS. 7A-7F are schematic cross-sectional views illustrating a method of fabricating the gate trench silicon carbide power MOSFET 300 of FIG. 6.

Figure 7A:
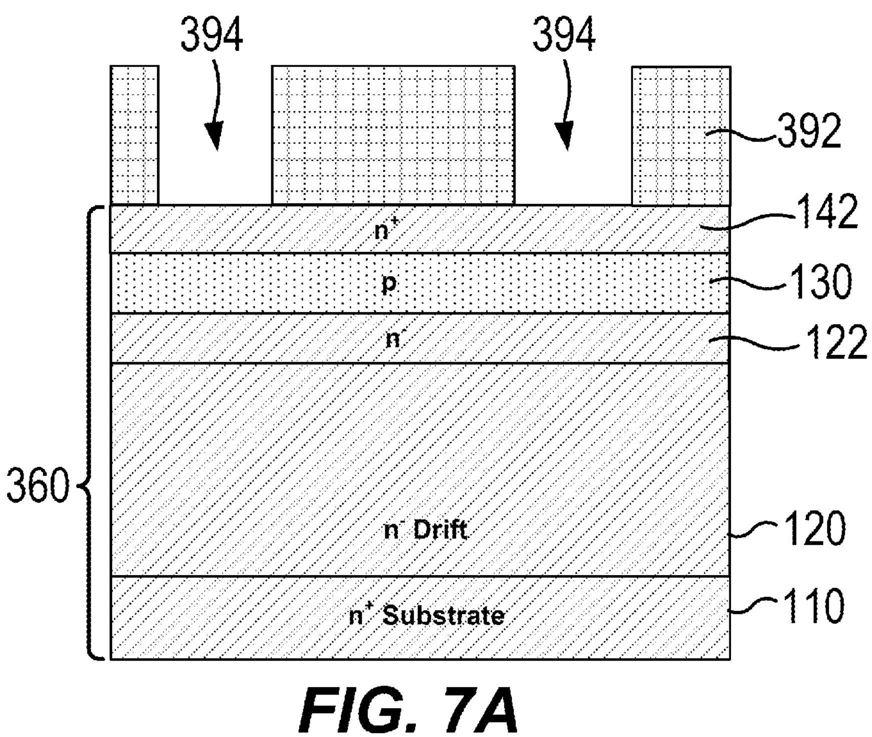
FIGS. 7A-7F are schematic cross-sectional views illustrating a method of fabricating the gate trench silicon carbide power MOSFET of FIG. 6.

Referring to FIG. 7A, the n-type silicon carbide substrate 110 is provided. The lightly-doped (n) silicon carbide drift layer 120 is then formed on an upper surface of the substrate 110, and the p-type well region 130 and n-type source layer 142 are formed in, for example, the same manner discussed above with reference to FIG. 3A. A first mask 392 such as, for example, an oxide mask is formed on the upper surface of the semiconductor layer structure 360 and is then patterned (e.g., using standard photolithography patterning techniques) to form openings 394 in the first mask 392 that expose selected portions of the semiconductor layer structure 360. The openings 394 are positioned above locations in the semiconductor layer structure 360 in which the deep well contact regions 332 are formed in a subsequent processing step.

Figure 7B:
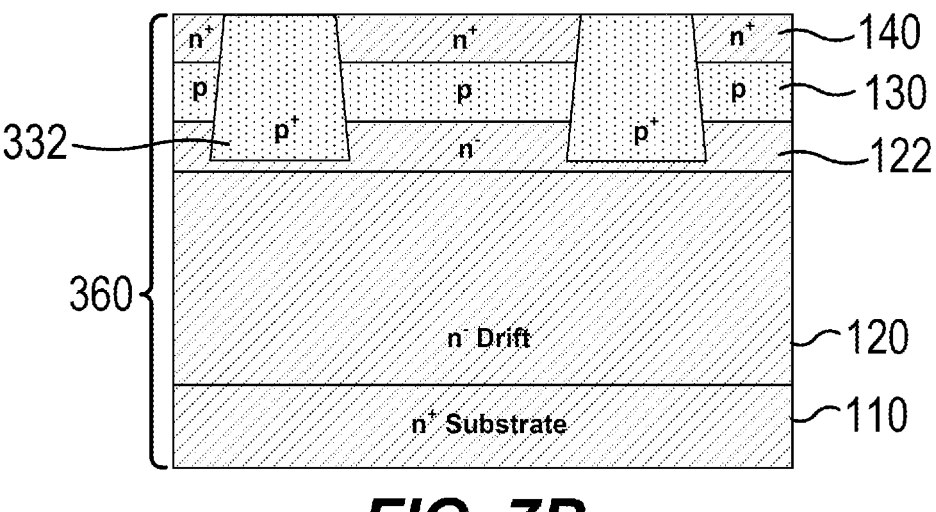

Next, referring to FIG. 7B, a high energy ion implantation process is performed to form the deep well contact regions 332. The deep well contact regions 332 may extend all of the way through the well region 130 into (or even through) the current spreading layer 122. The formation of the deep well contact regions 332 converts the n-type source layer 142 into a plurality of spaced-apart n-type source regions 140. The first mask 392 may then be removed.

Figure 7C:
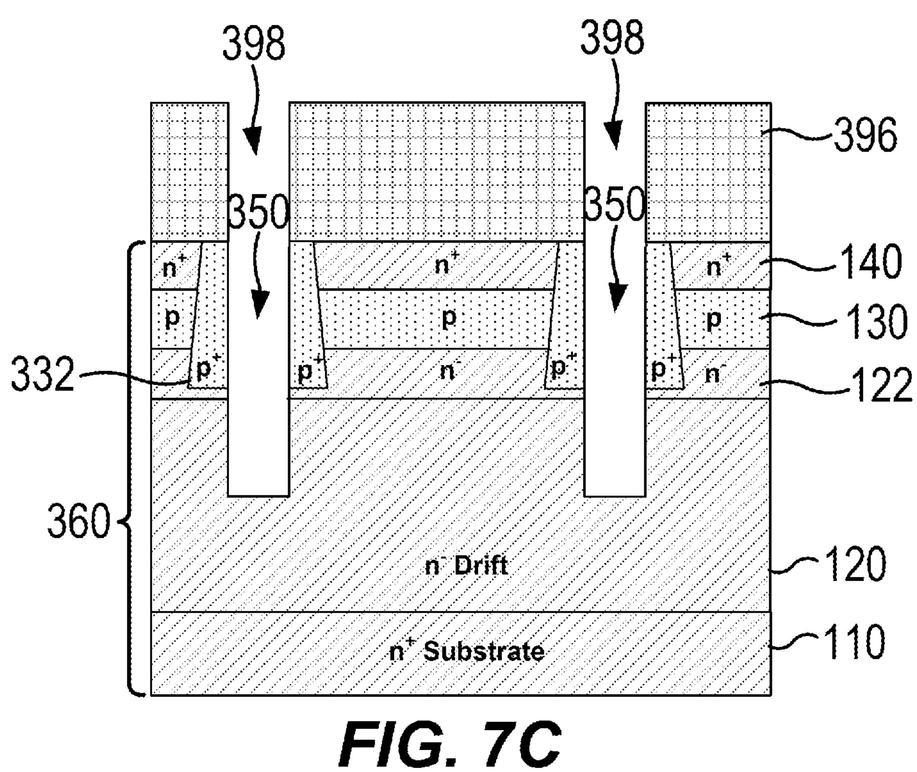

Referring to FIG. 7C, a second mask 396 (e.g., another oxide mask) may be formed to cover the semiconductor layer structure 360. The second mask 396 may then be patterned (e.g., using standard photolithography patterning techniques) to form openings 398 therein that expose selected portions of the semiconductor layer structure 360. An etching process is then performed using the second mask 396 as an etch mask to form a plurality of trenches 350 in the semiconductor layer structure 360. The trenches 350 are formed through the well contact regions 332 to extend into the drift layer 120. Each trench 350 may, for example, divide a respective one of the well contact regions into two well contact regions 332.

Figure 7D:
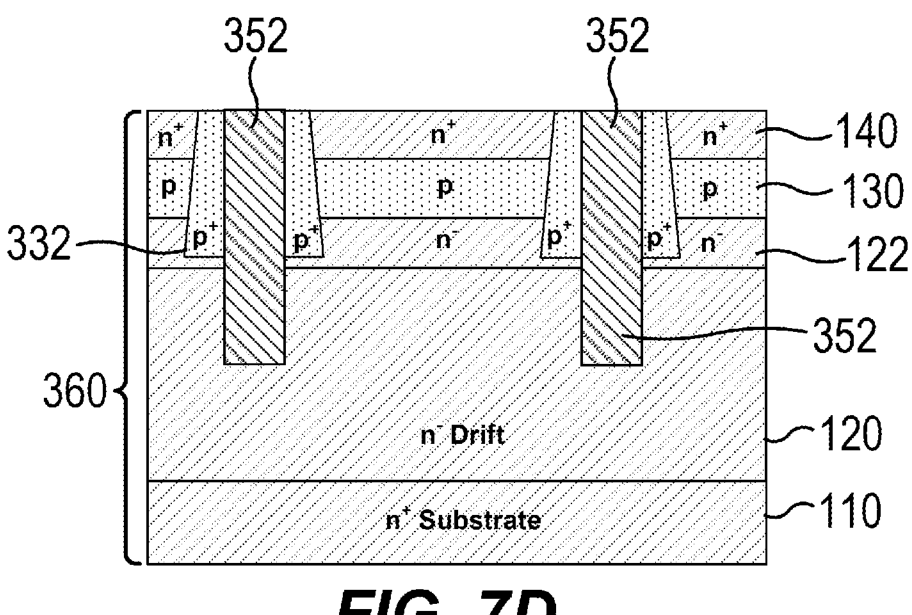

Referring to FIG. 7D, a conductive material 352 other than silicon carbide may be deposited or otherwise formed in each trench 350. The conductive material 352 may be, for example, polysilicon, nickel oxide or a metal that forms a Schottky contact with silicon carbide. The second mask 396 may then be removed.

Figures 7E, 7F:
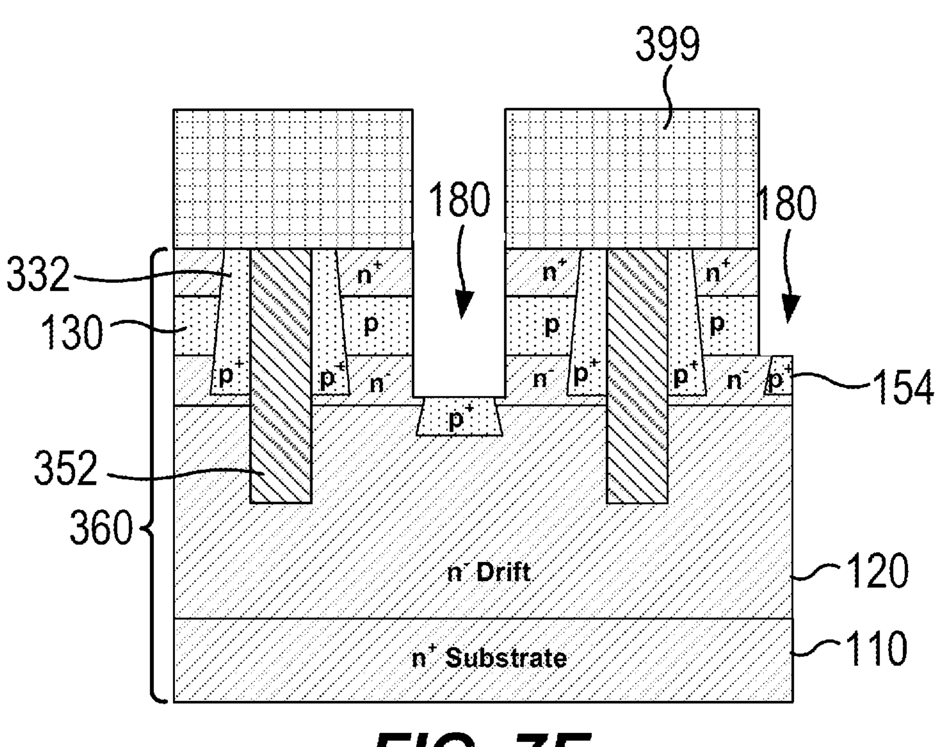

Referring to FIG. 7E, a third mask 399 (e.g., another oxide mask) may be formed to cover the semiconductor layer structure 360 and patterned to include openings where the gate trenches 180 will be formed. An etching process is performed to etch the exposed portions of the semiconductor layer structure 360 to form the gate trenches 180. As shown, in some embodiments, the well contact regions 332 may extend to about the same depth into the semiconductor layer structure 360 as the gate trenches 180. In other embodiments, the well contact regions 332 may extend deeper into the semiconductor layer structure 360 than the gate trenches 180. Alternatively, the gate trenches 180 may extend deeper into the semiconductor layer structure 360 than the well contact regions 332. Next, an ion implantation process is performed to implant p-type dopant ions into the portions of the semiconductor layer structure 360 that are underneath the gate trenches 180 to form the trench shielding patterns 154.

As shown in FIG. 7F, the gate oxide layers 182 and gate electrodes 184 may then be formed in the gate trenches 180, and the intermetal dielectric layers 188 are formed to cover the gate oxide layers 182 and gate electrodes 184. The source metallization layer 190 is then formed on the source regions 140, the intermetal dielectric layers 188, the conductive material 352 and the well contact regions 332.

Figures 8, 9:
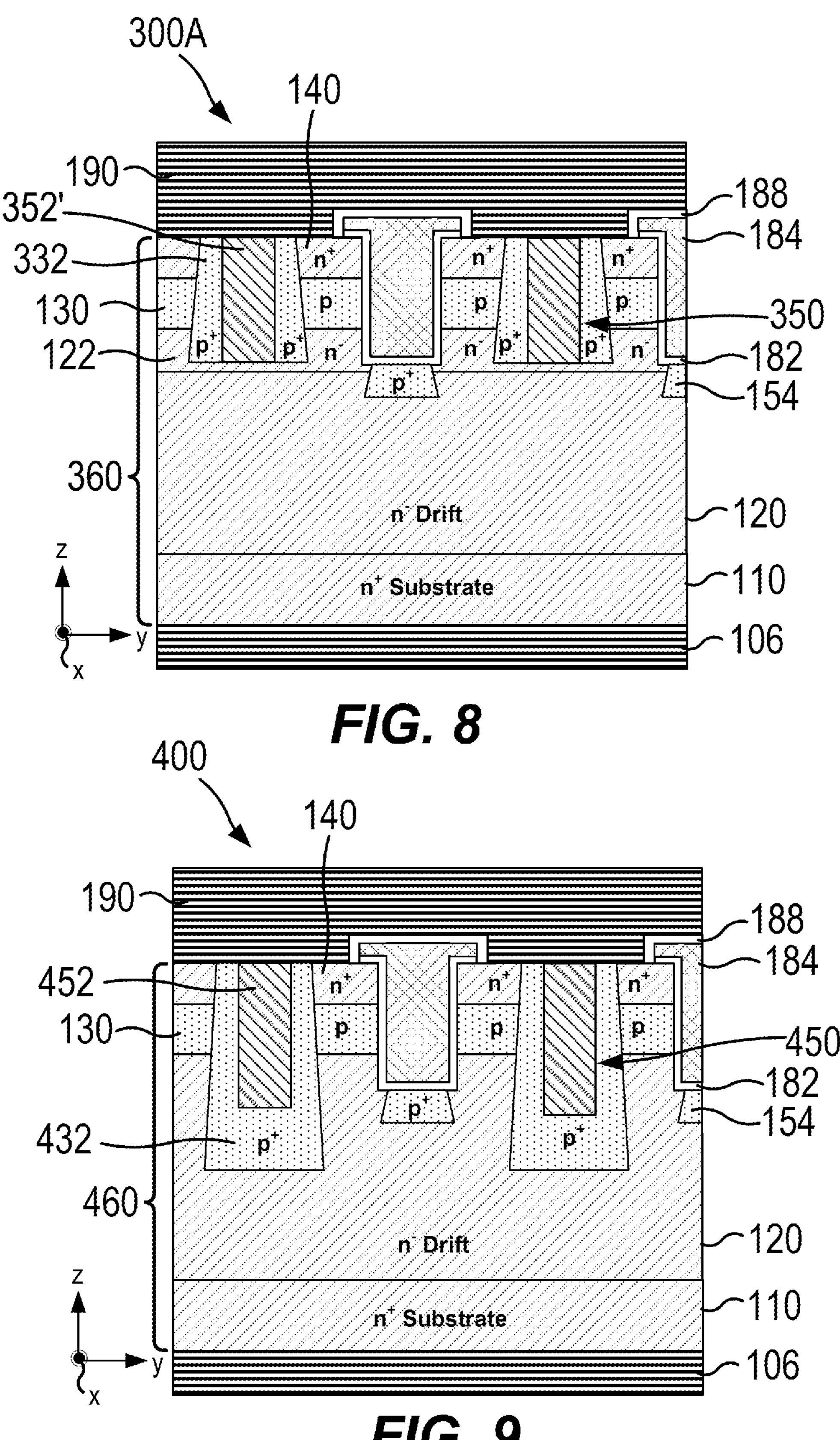
FIG. 8 is a schematic cross-sectional view of a modified version of the gate trench silicon carbide power MOSFET of FIG. 6.
FIG. 9 is a schematic cross-sectional view of a trench gate silicon carbide power MOSFET according to still further embodiments of the present invention.

FIG. 8 is a schematic cross-sectional view of a gate trench silicon carbide power MOSFET 300A that is a modified version of the gate trench silicon carbide power MOSFET 300. Gate trench silicon carbide power MOSFET 300A is almost identical to power MOSFET 300. As can be seen by comparing FIG. 7 and FIG. 8, the only difference between power MOSFET 300 and power MOSFET 300A is that power MOSFET 300A includes shallower support shields 352' that only extend as deep as the p-type well contact regions 332 so that bottoms of the support shields 352' and the p-type well contact regions 332 are coplanar with each other or approximately coplanar with each other.

FIG. 9 is a schematic cross-sectional view of a trench gate silicon carbide power MOSFET 400 according to still further embodiments of the present invention. The gate trench silicon carbide power MOSFET 400 may be identical to the gate trench silicon carbide power MOSFET 100 when viewed in plan view, and hence FIG. 2A also accurately represents power MOSFET 400. The cross-section of FIG. 9 is also taken along the line 2C-2C of FIG. 2A and illustrates how power MOSFET 400 differs from power MOSFET 300. As many of the elements of power MOSFET 400 are the same as the corresponding elements of poeer MOSFET 300, the same reference numerals are used for those elements in FIG. 6 and FIG. 9. The description below will focus on the elements of power MOSFET 400 that differ from power MOSFET 300.

As can be seen by comparing FIGS. 6 and 9, power MOSFETs 300 and 400 differ in their respective designs for the well contact regions 332, 432, the support shield trenches 350, 450 and support shields 352, 452. In particular, in power MOSFET 300 (FIG. 6) the well contact regions 332 extend less deeply into the semiconductor layer structure 360 than the support shield trenches 350, while in power MOSFET 400 (FIG. 9) the well contact regions 432 extend more deeply into the semiconductor layer structure 460 than the trenches 450. Thus, in power MOSFET 400 the conductive material 452 that fills each trench 450 is surrounded by the well contact regions 452, and the primary purpose of the conductive material 452 may be to provide a low resistance electrical connection between the source metallization 190 and the well contact regions 432. The electrical field blocking function during reverse blocking operation (to protect the gate oxide layer 182) is performed by the deep well contact regions 432 in power MOSFET 400. The conductive material 452 may be a conductive material other than silicon carbide such as, for example, polysilicon, nickel oxide or a metal that forms a Schottky contact with silicon carbide. While not shown in FIG. 9, in still other embodiments the conductive material 452 may be the source metallization layer 190 (i.e., the source metallization layer 190 fills the trenches 450). This same modification may be made to MOSFET 300 of FIG. 6, MOSFET 300A of FIG. 8 and/or MOSFETs 400A, 400B of FIGS. 10A-10B (discussed below).

In power MOSFET 400, the well contact regions 432 may have a p-type dopant concentration of, for example, between $5\times10^{16}$ to $1\times10^{22}$. In some embodiments, the well contact regions 432 may have a p-type dopant concentration that is at least an order of magnitude higher than the p-type dopant concentration of the well region 130. The well contact regions 432 may extend between 0.1 and 4.0 microns into the semiconductor layer structure 460. In some embodiments, the well contact regions 432 may extend deeper into the semiconductor layer than the gate trenches 180. In some embodiments, the well contact regions 432 may extend deeper into the semiconductor layer than the trench shielding regions 154.

The trenches 450 may be formed to any desired depth. In some embodiments, the trenches 450 may extend completely through the well region 130 but not extend as deeply as the gate trenches 180 into the semiconductor layer structure 460. In other embodiments, the trenches 450 may extend more deeply into the semiconductor layer structure 460 than the gate trenches 180.

FIGS. 10A-10B are schematic cross-sectional views of gate trench silicon carbide power MOSFETs 400A, 400B, respectively, that are modified versions of the gate trench silicon carbide power MOSFET 400 of FIG. 9. Gate trench silicon carbide power MOSFETs 400A, 400B are almost identical to MOSFET 400, so the discussion below will focus solely on the difference between each of MOSFETs 400A, 400B and MOSFET 400.

As can be seen by comparing FIG. 9 and FIG. 10A, the only difference between MOSFET 400 and MOSFET 400A is that MOSFET 400A includes a pair of p-type well contact regions 432' between each pair of adjacent gate electrodes 184. Each support shield 452 is positioned between the two well contact regions 432' of each pair of well contact regions 432'. As a result, the bottom of each support shield may directly contact the drift layer 120.

As can be seen by comparing FIG. 9 and FIG. 10B, the only difference between MOSFET 400 and MOSFET 400B is that MOSFET 400B includes recessed gate electrodes 184' that have top surfaces that are below the upper surface of the semiconductor layer structure 460. This arrangement advantageously reduce the peak electric fields in the upper corners of the gate oxide layer 182 during on-state operation. It will be appreciated that any of the semiconductor devices according to embodiments of the present invention that are discussed above may be modified to have the gate electrode design shown in FIG. 10B to provide additional embodiments of the present invention.

Figure 11:
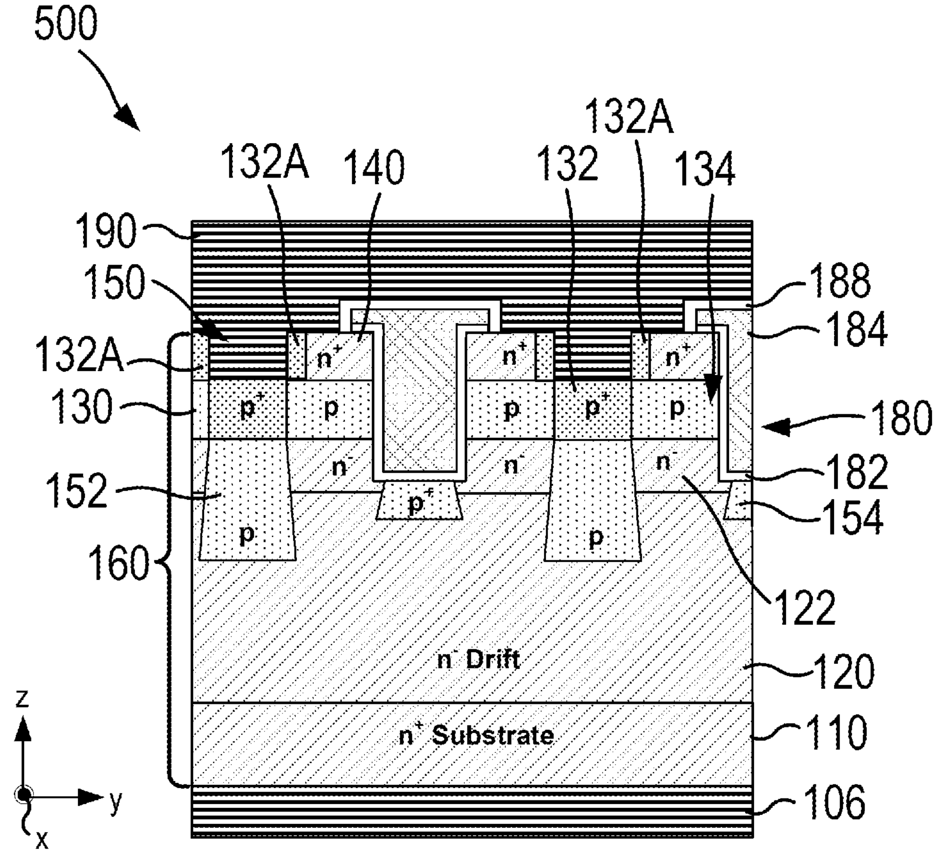
FIG. 11 is a schematic cross-sectional view of another modified version of the gate trench silicon carbide power MOSFET of FIGS. 2A-2B where the cross-section is taken along line 2C-2C of FIG. 2A.

FIG. 11 is a schematic cross-sectional view of a gate trench silicon carbide power MOSFET 500 that is another modified version of the gate trench silicon carbide power MOSFET 100 of FIGS. 2A-2C. Gate trench silicon carbide power MOSFET 500 is almost identical to MOSFET 100, so the discussion below will focus solely on the difference between each of MOSFET 500 and MOSFET 100.

As shown in FIG. 11, MOSFET 500 differs from MOSFET 100 in that MOSFET 500 includes heavily-doped p-type (p+) supplemental well contact regions 132A that are adjacent the source regions 140 and above the p-well region 130. The provision of the supplemental well contact regions 132A increases the amount of contact between the source metallization layer 190 and the p-type material in the semiconductor layer structure 160 to provide a lower resistance connection therebetween. The supplemental well contact regions 132A may be heavily-doped (p+) or moderately-doped (p) with p-type dopants, and may be formed, for example, in the same ion implantation step used to form the well contact regions 132. The provision of the supplemental well contact regions 132A may decrease the amount of contact between the source metallization layer 190 and the source regions 140. Consequently, the lateral width of the source regions 140 may be increased in some cases in MOSFET 500 as compared to MOSFET 100.

Embodiments of the present invention are primarily described above with respect to cross-sectional diagrams. It will be appreciated that in each of the depicted embodiments of the present invention the well contact regions (e.g., 132, 332, 432) and the support shields (e.g., 152, 352, 452) may be elongated structures that extend continuously into the page in the figures across the active region of the semiconductor devices. However, it will also be appreciated that the well contact regions (e.g., 132, 332, 432) and the support shields (e.g., 152, 352, 452) may instead be segmented structures in other embodiments that have sections removed so that these structures do not extend continuously into the pages in the figures, but instead are structures with multiple collinear segments extending into the page.

In the description above, each example embodiment has a certain conductivity type. It will be appreciated that opposite conductivity type devices may be formed by simply reversing the conductivity of the n-type and p-type layers in each of the above embodiments. Thus, it will be appreciated that the present invention covers both n-channel and p-channel devices for each different device structure (e.g., MOSFET, IGBT, etc.).

The present invention has primarily been discussed above with respect to silicon carbide based power semiconductor devices. It will be appreciated, however, that silicon carbide is used herein as an example and that the devices discussed herein may be formed in any appropriate wide band-gap semiconductor material system. As an example, gallium nitride based semiconductor materials (e.g., gallium nitride, aluminum gallium nitride, etc.) may be used instead of silicon carbide in any of the embodiments described above.

Embodiments of the present invention have been described above with reference to the accompanying drawings, in which embodiments of the invention are shown. It will be appreciated, however, that this invention may, however, be embodied in many different forms and should not be construed as limited to the embodiments set forth above. Rather, these embodiments are provided so that this disclosure will be thorough and complete, and will fully convey the scope of the invention to those skilled in the art. Like numbers refer to like elements throughout.

Herein, the term “plurality” means two or more. Herein, “substantially” means within +/−10%.

It will be understood that, although the terms first, second, etc. are used throughout this specification to describe various elements, these elements should not be limited by these terms. These terms are only used to distinguish one element from another. For example, a first element could be termed a second element, and, similarly, a second element could be termed a first element, without departing from the scope of the present invention. The term “and/or” includes any and all combinations of one or more of the associated listed items.

The terminology used herein is for the purpose of describing particular embodiments only and is not intended to be limiting of the invention. As used herein, the singular forms “a”, “an” and “the” are intended to include the plural forms as well, unless the context clearly indicates otherwise. It will be further understood that the terms “comprises” “comprising,” “includes” and/or “including” when used herein, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being “on” or extending “onto” another element, it can be directly on or extend directly onto the other element or intervening elements may also be present. In contrast, when an element is referred to as being “directly on” or extending “directly onto” another element, there are no intervening elements present. It will also be understood that when an element is referred to as being “connected” or “coupled” to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "top" or "bottom" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Embodiments of the invention are also described with reference to a flow chart. It will be appreciated that the steps shown in the flow chart need not be performed in the order shown.

Some embodiments of the invention are described with reference to semiconductor layers and/or regions which are characterized as having a conductivity type such as n-type or p-type, which refers to the majority carrier concentration in the layer and/or region. Thus, n-type material has a majority equilibrium concentration of negatively charged electrons, while p-type material has a majority equilibrium concentration of positively charged holes. Some material may be designated with a "+" or "−" (as in n+, n−, p+, p−, n++, n−−, p++, p−−, or the like), to indicate a relatively larger ("+") or smaller ("−") concentration of majority carriers compared to another layer or region. However, such notation does not imply the existence of a particular concentration of majority or minority carriers in a layer or region.

In the drawings and specification, there have been disclosed typical embodiments of the invention and, although specific terms are employed, they are used in a generic and descriptive sense only and not for purposes of limitation, the scope of the invention being set forth in the following claims.

The invention claimed is:

1. A semiconductor device, comprising:

a silicon carbide based semiconductor layer structure that includes a drift layer having a first conductivity type;

a gate trench that extends to a first depth into the semiconductor layer structure;

a gate electrode in the gate trench;

a support shield trench that extends to a second depth into the semiconductor layer structure, where the second depth is less than the first depth; and a source metallization layer on the semiconductor layer structure and extending into the support shield trench, wherein the semiconductor layer structure further comprises a source region, and the source metallization layer directly contacts both an upper surface and a side surface of the source region.

2. The semiconductor device of claim 1, wherein the gate electrode vertically overlaps the source region.

3. The semiconductor device of claim 1, wherein a maximum width of the support shield is greater than a maximum second width of the support shield trench.

4. The semiconductor device of claim 1, wherein the semiconductor layer structure further comprises a well contact region having a second conductivity type, and the source metallization layer directly contacts an upper surface of a portion of the well contact region that is underneath the support shield trench.

5. The semiconductor device of claim 4, wherein the semiconductor layer structure further comprises a support shield having the second conductivity type underneath the well contact region, where the support shield extends farther into the semiconductor layer structure than does the gate trench.

6. The semiconductor device of claim 5, wherein the well contact region directly contacts an upper surface of the support shield.

7. The semiconductor device of claim 5, wherein semiconductor layer structure further comprises:

a well region having the second conductivity type on an upper surface of the drift layer wherein the source metallization layer directly contacts a portion of the well region that is underneath the source region.

8. The semiconductor device of claim 5, wherein the semiconductor layer structure further comprises a trench shielding region having the second conductivity type underneath the gate trench.

9. The semiconductor device of claim 8, wherein the support shield extends farther downwardly into the semiconductor layer structure than does the trench shielding region.

10. A semiconductor device, comprising:

a silicon carbide based semiconductor layer structure;

a support shield trench in the semiconductor layer structure;

a metal layer that extends into the support shield trench;

a gate trench in the semiconductor layer structure; and a gate electrode in the gate trench, wherein the silicon carbide based semiconductor layer structure comprises:

a drift layer having a first conductivity type;

a well region having the second conductivity type on the drift layer;

a source region having the first conductivity type on the well region; and a trench shielding region having the second conductivity type underneath the gate trench;

a support shield having the second conductivity type below the support shield trench and extending into the drift layer, wherein the support shield extends deeper into the semiconductor layer structure than does the trench shielding region.

11. The semiconductor device of claim 10, wherein the gate trench extends farther downwardly into the semiconductor layer structure than does the support shield trench.

12. The semiconductor device of claim 10, wherein the metal layer directly contacts both an upper surface and a side surface of the source region.

13. The semiconductor device of claim 10, wherein a maximum width of the support shield is greater than a maximum second width of the support shield trench.

14. The semiconductor device of claim 10, wherein the semiconductor layer structure further comprises a well contact region having the second conductivity type in the well region, and wherein an upper surface of the well contact region is recessed below an upper surface of the source region.

15. The semiconductor device of claim 14, wherein an upper surface of the well contact region is recessed below an upper surface of the well region.

16. A semiconductor device that includes a plurality of unit cell transistors, comprising:

a silicon carbide based semiconductor layer structure that comprises;

a drift layer having a first conductivity type;

a well region having a second conductivity type on the drift layer;

a source region having the first conductivity type on the well region; and a well contact region having the second conductivity type in the well region, the well contact region being a portion of the well region that has a higher dopant concentration, where an upper surface of the well contact region is recessed below an upper surface of the source region;

a gate trench that extends to a first depth into an upper surface of the semiconductor layer structure;

a source metallization layer that extends in between source regions of adjacent ones of the unit cell transistors to directly contact an uppermost portion of the well contact region.

17. The semiconductor device of claim 16, wherein the semiconductor layer structure further comprises a support shield having the second conductivity type underneath the well contact region.

18. The semiconductor device of claim 17, wherein the source metallization layer directly contacts the well contact region and the well contact region directly contacts the support shield.

19. The semiconductor device of claim 17, wherein the source metallization layer directly contacts a side surface of the source region.

20. The semiconductor device of claim 17, wherein the well contact region has a first doping concentration of second conductivity type dopants that exceeds a second doping concentration of second conductivity type dopants of the well region and that also exceeds a third doping concentration of second conductivity type dopants of the support shield.

* * * * *